United States Patent
Yudasaka

(10) Patent No.: US 6,885,148 B2
(45) Date of Patent: Apr. 26, 2005

(54) ACTIVE MATRIX DISPLAY DEVICE

(75) Inventor: Ichio Yudasaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/616,991

(22) Filed: Jul. 11, 2003

(65) Prior Publication Data

US 2004/0008311 A1 Jan. 15, 2004

Related U.S. Application Data

(62) Division of application No. 10/102,878, filed on Mar. 22, 2002, now Pat. No. 6,642,651, which is a division of application No. 09/284,802, filed as application No. PCT/JP98/03699 on Aug. 20, 1998, now Pat. No. 6,380,672.

(30) Foreign Application Priority Data

Aug. 21, 1997 (JP) .............................................. 9-225434

(51) Int. Cl.[7] .............................. H05B 33/22; H01J 1/62
(52) U.S. Cl. ........................ 313/504; 313/500; 313/505; 313/506; 313/509; 313/497; 313/498; 345/76; 345/87; 345/92; 345/93
(58) Field of Search ................................. 313/497, 498, 313/483, 500, 502; 345/76, 87, 92, 93; 315/169.1, 169, 169.3

(56) References Cited

U.S. PATENT DOCUMENTS

| | | | | |
|---|---|---|---|---|
| 4,006,383 A | * | 2/1977 | Luo et al. ................. | 315/169.3 |
| 5,670,792 A | * | 9/1997 | Utsugi et al. .................. | 257/59 |
| 5,684,365 A | | 11/1997 | Tang et al. | |
| 5,701,055 A | | 12/1997 | Nagayama et al. | |
| 5,742,129 A | | 4/1998 | Nagayama et al. | |
| 6,147,451 A | * | 11/2000 | Shibata et al. .............. | 313/506 |
| 6,194,837 B1 | * | 2/2001 | Ozawa ..................... | 315/169.1 |
| 6,630,784 B1 | * | 10/2003 | Yoneda ....................... | 313/504 |

FOREIGN PATENT DOCUMENTS

| | | | |
|---|---|---|---|
| EP | 0 717 446 A2 | 6/1996 | |
| EP | 0 862 156 A1 | 9/1998 | ............. G09F/9/30 |
| JP | 52-64891 | 5/1977 | |
| JP | A 59-058468 | 4/1984 | |
| JP | A 60-017479 | 1/1985 | ............. G09F/9/35 |
| JP | A-2-66867 | 3/1990 | |
| JP | A 08-202287 | 8/1996 | ............. G09F/9/30 |
| JP | A 08-227276 | 9/1996 | ............. G09F/9/30 |
| JP | A-9-161970 | 6/1997 | |
| JP | 9-230311 A | 9/1997 | ........... G02F/1/133 |
| JP | A 08-241048 | 9/1998 | |
| JP | A 11-003048 | 1/1999 | |
| JP | A 11-024604 | 1/1999 | ............. G09F/9/33 |
| JP | A 11-065487 | 3/1999 | ............. G09F/9/33 |
| JP | A 2004-046210 | 2/2004 | |
| WO | WO 98/12689 | 3/1998 | ............. G09F/9/30 |

\* cited by examiner

*Primary Examiner*—Vip Patel
*Assistant Examiner*—Sikha Roy
(74) *Attorney, Agent, or Firm*—Oliff & Berridge, PLC

(57) ABSTRACT

In order to provide an active matrix display device in which a thick insulating film is preferably formed around an organic semiconductive film of a thin film luminescent device without damaging the thin film luminescent device, the active matrix display device is provided with a bank layer (bank) along a data line (sig) and a scanning line (gate) to suppress formation of parasitic capacitance in the data line (sig), in which the bank layer (bank) surrounds a region that forms the organic semiconductive film of the thin film luminescent device by an ink-jet process. The bank layer (bank) includes a lower insulating layer formed of a thick organic material and an upper insulating layer of an organic material which is deposited on the lower insulating layer and has a smaller thickness so as to avoid contact of the organic semiconductive film with the upper insulating layer.

8 Claims, 26 Drawing Sheets

(RELATED ART)

ACTIVE MATRIX DISPLAY DEVICE

This is a Division of application Ser. No. 10/102,878 filed Mar. 22, 2002 issued as U.S. Pat. No. 6,642,651 B2 on Nov. 4, 2003, which in turn is a Division of application Ser. No. 09/284,802 filed Apr. 21, 1999 issued as U.S. Pat. No. 6,380,672 B1 on Apr. 30, 2002, which in turn is a U.S. National Stage of PCT/JP98/03699, filed Aug. 20, 1998. The entire disclosure of the prior applications is hereby incorporated by reference herein in its entirety.

BACKGROUND OF THE INVENTION

1. Field of the Invention

The present invention relates to active matrix display devices which control thin film luminescent devices, such as electroluminescent (EL) devices emitting light by a driving current flowing in an organic semiconductive film, and light-emitting diode (LED) devices using thin film transistors (hereinafter referred to as TFTs).

2. Description of Related Art

Active matrix display devices using current-control-type luminescent devices, such as EL devices or LED devices, have been proposed. The fact that luminescent devices used in such types of display devices have self-luminescent functions provides advantages, such as obviating installation of a backlight, whereas backlights are essential for liquid crystal display devices, and providing a wider viewing angle.

FIG. 22 is a block diagram of an active matrix display device using charge-injection-type organic EL devices. In the active matrix display device 1A shown in the drawing, a plurality of scanning lines gate, a plurality of data lines sig extending in a direction perpendicular to a direction of extension of the scanning lines gate, a plurality of common feed lines com extending along the data lines sig, and a plurality of pixels 7 in a matrix formed by the data lines sig and the scanning lines gate, are formed on a transparent substrate 10.

A data line driving circuit 3 and a scanning line driving circuit 4 are provided for the data lines sig and the scanning lines gate, respectively. Each pixel 7 is provided with a conduction control circuit 50 for supplying scanning signals from a scanning line gate, and a thin film luminescent device 40 emitting based on image signals supplied from a data line sig through the conduction control circuit 50.

In this example, the conduction control circuit 50 has a first TFT 20 for supplying scanning signals from the scanning line gate to a gate electrode; a holding capacitor cap for holding image signals supplied from the data line sig through the first TFT 20; and a second TFT 30 for supplying the image signals held in the holding capacitor cap to the gate electrode. The second TFT 30 and the thin film luminescent device 40 are connected in series between an opposite electrode op (described below) and a common feed line com. The thin film luminescent device 40 emits light by a driving current from the common feed line com when the second TFT 30 is in an ON mode, and this emitting mode is maintained by a holding capacitor cap for a predetermined time.

In such a configuration of an active matrix display device 1A, as shown in FIGS. 23, 24(A), and 24(B), the first TFT 20 and the second TFT 30 are formed of islands of a semiconductive film in each pixel 7. The first TFT 20 is provided with a gate electrode 21 as a part of a scanning line gate. In the first TFT 20, one source-drain region is electrically connected to a data line sig through a contact hole in a first insulating interlayer 51, and the other region is connected to a drain electrode 22. The drain electrode 22 extends towards the region of the second TFT 30, and this extension is electrically connected to a gate electrode 31 of the second TFT 30 through a contact hole in the first insulating interlayer 51. One source-drain region of the second TFT 30 is electrically connected to a relay electrode 35 through a contact hole of the first insulating interlayer 51, and the relay electrode 35 is electrically connected to a pixel electrode 41 of the thin film luminescent device 40 through a contact hole in a second insulating interlayer 52.

Each pixel electrode 41 is independently formed in each pixel 7, as shown in FIGS. 23, 24(B), and 24(C). An organic semiconductive film 43 and an opposite electrode op are formed above the pixel electrode 41 in that order. Although the organic semiconductive film 43 is formed in each pixel 7, a stripe film may be formed over a plurality of pixels 7. The opposite electrode op is formed not only in a display section 11 including pixels 7, but also over the entire surface of the transparent substrate 10.

With reference to FIGS. 23 and 24(A) again, the other source-drain region of the second TFT 30 is electrically connected to the common feed line com through a contact hole in the first insulating interlayer 51. An extension 39 of the common feed line com faces an extension 36 of the gate electrode 31 in the second TFT 30 separated by the first insulating interlayer 51 as a dielectric film to form a holding capacitor cap.

In the active matrix display device 1A, however, only the second insulating interlayer 52 is disposed between the opposite electrode op facing the pixel electrode 41 and the data line sig on the same transparent substrate 10, which is unlike liquid crystal active matrix display devices; hence, a large capacitance is formed in the data line sig, and the data line driving circuit 3 is heavily loaded.

Accordingly, as shown in FIGS. 22, 23, 25(A), 25(B), and 25(C), the present inventors propose a reduction in parasitic capacitance in the data line sig by providing a thick insulating film (a bank layer bank; the region shaded with lines slanting downward to the left at a wide pitch) between the opposite electrode op and the data line sig. Furthermore, the present inventors propose that the region for forming the organic semiconductive film 43 be surrounded with the insulating film (bank layer bank) to block a solution discharged from an ink-jet head and to prevent bleeding of the solution towards sides in the formation of the organic semiconductive film 43.

When the entire bank layer bank is formed of a thick inorganic material in adoption of such a configuration, a problem of a prolonged film forming time arises. When the thick inorganic film is patterned, the pixel electrode 41 may be damaged due to overetching. On the other hand, when the bank layer bank is formed of an organic material, such as a resist, the organic semiconductive film 43 may deteriorate at the boundary between the organic semiconductive film 43 and the bank layer bank by the effects of the solvent components contained in the organic material in the bank layer bank.

Since formation of a thick bank layer bank causes formation of a large step difference bb, the opposite electrode op formed above the bank layer bank readily breaks on the step difference bb. Such breakage of the opposite electrode op due to the step difference bb causes insulation of the opposite electrode op from the neighboring opposite electrodes op to form point or linear defects in the display. When the opposite electrode op breaks along the outer periphery of the bank layer bank which covers the surfaces of the data line driving circuit 3 and the scanning line driving circuit 4, the opposite electrode op in the display section 11 is completely insulated from a terminal 12 and thus no image is displayed.

SUMMARY OF THE INVENTION

Accordingly, it is an object of the present invention in view of the above problems to provide an active matrix display device, without damage of thin film luminescent devices, having a thick insulating film satisfactorily formed around an organic semiconductive film in the thin film luminescent devices.

It is another object of the present invention to provide an active matrix display device without breakage of an opposite electrode formed on a thick insulating film which is formed around an organic semiconductive film to reduce parasitic capacitance.

The present invention for solving the above-mentioned problems is characterized by an active matrix display device comprising a display region including a plurality of scanning lines on a substrate, a plurality of data lines extending in a direction perpendicular to a direction of extension of the scanning lines, and a plurality of pixels arranged in a matrix bounded by the data lines and the scanning lines; each of the pixels being provided with a thin film luminescent device having a conduction control circuit containing a thin film transistor that supplies a scanning signal to a gate electrode through one of the scanning lines, a pixel electrode, an organic semiconductive film deposited above the pixel electrode, and an opposite electrode deposited above the organic semiconductive film; the thin film luminescent device emitting light based on an image signal supplied from the data line through the conduction control circuit; wherein the region that forms the organic semiconductive film is divided by an insulating film which is thicker than the organic semiconductive film; and the insulating film comprises a lower insulating layer which is formed of an inorganic material and is thicker than the organic semiconductive film, and an upper insulating layer which is deposited on the lower insulating layer and is formed of an organic material.

In the present invention, the data line will form large parasitic capacitance if the opposite electrode is formed on the entire surface of the display section to face the data line; however, a thick insulating film is provided between the data line and the opposite electrode in the present invention to prevent formation of the parasitic capacitance in the data line. As a result, a load on the data line driving circuit is reduced, and low energy consumption and high-speed display operation are achieved. If the thick insulating film is formed of only an inorganic material, a long film deposition time is required, resulting in low productivity. In the present invention, only the lower insulating layer in contact with the organic semiconductive film of the thin film luminescent device is formed of an inorganic material, and an upper insulating layer that includes an organic material, such as a resist, is formed thereon. Improved productivity is provided, since the upper insulating layer formed of an organic material facilitates formation of a thick film. The upper insulating layer does not come into contact with the organic semiconductive film, but the lower insulating layer formed of an inorganic material does come into contact with the organic semiconductive film; hence, the organic semiconductive film is protected from deterioration affected by the upper insulating layer. Accordingly, the thin film luminescent device does not cause decreased luminescent efficiency or reliability.

It is preferable in the present invention that the upper insulating layer be deposited in an inner region of the lower insulating layer so as to have a width narrower than that of the lower insulating layer. Such a two-step configuration prevents contact of the upper insulating layer formed of an organic material with the organic semiconductive film; hence deterioration of the organic semiconductive film can be more securely prevented. In such a two-step configuration, both the lower insulating layer and the upper insulating layer may be formed of inorganic materials.

Another aspect of the present invention is an active matrix display device comprising a display region including a plurality of scanning lines on a substrate, a plurality of data lines extending in a direction perpendicular to a direction of extension of the scanning lines, and a plurality of pixels arranged in a matrix bounded by the data lines and the scanning lines; each of the pixels being provided with a thin film luminescent device having a conduction control circuit containing a thin film transistor that supplies a scanning signal to a gate electrode through one of the scanning lines, a pixel electrode, an organic semiconductive film deposited above the pixel electrode, and an opposite electrode deposited above the organic semiconductive film; the thin film luminescent device emitting light based on an image signal supplied from the data line through the conduction control circuit; wherein the region that forms the organic semiconductive film is divided by an insulating film which is thicker than the organic semiconductive film; and the insulating film comprises a lower insulating layer formed of an inorganic material, and an upper insulating layer, formed of an inorganic material, so as to have a width which is narrower than that of the lower insulating layer.

In such a configuration, after films formed of inorganic materials, constituting a lower insulating layer and an upper insulating layer, are formed, the upper insulating layer is patterned. Since the lower insulating layer functions as an etching stopper, the pixel electrodes will not be damaged by slight overetching. After the patterning, the lower insulating layer is patterned. Since only one layer of the lower insulating layer is etched, the etching is readily controlled so that overetching, which would damage the pixel electrodes, does not occur.

It is preferable in the present invention that the conduction control circuit be provided with a first TFT that supplies the scanning signal to the gate electrode, and a second TFT of which the gate electrode is connected to the data line through the first TFT, and that the second TFT and the thin film luminescent device be connected in series between a common feed line formed in addition to the data line and the scanning line supplying a drive current and the opposite electrode. Although the conduction control circuit can be formed of a TFT and a holding capacitor, the conduction control circuit of each pixel is preferably formed of two TFTs and two holding capacitors to improve display quality.

It is preferable in the present invention that the insulating film be used as a bank layer which prevents bleeding of a discharged solution when the organic semiconductive film is formed by an ink-jet process in a region delimited by the insulating film. The insulating film preferably has a thickness of 1 $\mu$m or more.

It is preferable in the present invention that a region, overlapping the area that forms the conduction control circuit in the region that forms the pixel electrode, be covered with the insulating film. That is, it is preferable that among the region that forms the pixel electrode, the thick insulating film be opened only at the flat section not having the conduction control circuit and the organic semiconductive film be formed only at the interior thereof. Such a configuration can prevent display irregularities due to an irregular thickness of the organic semiconductive film.

A thinner section of the organic semiconductive film causes a concentration of the driving current of the thin film luminescent device and decreased reliability; however, this configuration can prevent such a problem. If the organic semiconductive film emits light due to a driving current between a pixel electrode and the opposite electrode in the region overlapping the conduction control circuit, the light is shielded by the conduction control circuit and does not contribute to display. The driving current not contributing to display by the shielding effect of the conduction control circuit is an unavailable current.

In the present invention, the thick insulating film is formed at the section, in which such an unavailable current is expected, to prevent formation of the unavailable current. As a result, a current in the common feed line can be reduced. Thus, by reducing the width of the common feed line, a luminescent area can be increased, improving display characteristics, such as luminance and contrast.

In the present invention, the corners bounded by the insulating film may be rounded so that the organic semiconductive film has a rounded planar shape. The organic semiconductive film having such a shape avoids the concentration of the driving current at the corners, hence defects, such as insufficient voltage resistance, can be prevented at the corners.

When the organic semiconductive film having a striped pattern is formed, the lower insulating layer of the insulating film is formed so as to cover the area for forming the conduction control circuit in the region that forms the pixel electrode, the data line, the common feed line, and the scanning line, whereas the upper insulating layer is formed so as to form a striped pattern along the data line, and the organic semiconductive film is formed in the region bounded by the striped pattern of the upper insulating layer by, for example, an ink-jet process.

In such a configuration, the conduction control circuit is covered with the lower insulating layer so that only the organic semiconductive film formed at the flat section of the pixel electrode contributes to luminescence. That is, the thin film luminescent device is formed only at the flat section of the pixel electrode. Thus, the resulting organic semiconductive film has a constant thickness and does not display irregularities. Since the lower insulating layer prevents a driving current in the section not contributing to display, an unavailable current in the common feed line can be prevented.

In such a configuration, the section in which the lower insulating layer overlaps the upper insulating layer can be used as a bank layer to prevent bleeding of a discharged solution when the organic semiconductive film is formed by an ink-jet process. When the insulating film is used as a bank layer, the overlapping section of the lower insulating layer and the upper insulating layer preferably has a thickness of 1 $\mu$m or more.

It is preferable in the present invention that the insulating film have a first discontinuities portion so that opposite electrodes of adjacent pixels are connected to each other at flat sections formed by the first discontinuities portion. The thick insulating film in the present invention may form a large step which causes breakage of the opposite electrode formed thereon; however, the first discontinuities portion formed at predetermined positions of the thick insulating film are planarized. Since the opposite electrodes of individual regions are electrically connected to each other at the flat sections corresponding to the first discontinuities portion, the opposite electrodes are protected from breakage even if breakage occurs at the step due to the insulating film. Since breakage of the opposite electrode formed above the insulating film does not occur when a thick insulating film is formed around the organic semiconductive film to suppress the parasitic capacitance, display quality and reliability of the active matrix display device can be improved.

When the insulating film is formed along the data line and the scanning line so as to surround the region that forms the organic semiconductive film, the first discontinuities portion are preferably formed between the adjacent pixels in the direction of the extending data line, between the adjacent pixels in the direction of the extending scanning line, or between the adjacent pixels in these directions.

When the insulating film extends in a striped pattern along the data line, the first discontinuity may be formed on at least one end of the extending direction.

It is preferable in the present invention that the periphery of the display section be provided with a data line driving circuit that supplies data signals through the data lines, and a scanning line driving circuit that supplies scanning signals through the scanning lines, that the insulating film be also formed above the scanning line driving circuit and the data line driving circuit, and that the insulating film have a second discontinuity at a position between the region that forms the scanning line driving circuit and the region for forming the data line driving circuit so that the opposite electrodes at the display section and at the peripheral section of the substrate are connected through the flat section. Even if breakage of the opposite electrodes occurs along the periphery of the insulating film which covers the data line driving circuit and the scanning line driving circuit, the opposite electrode at the display section is connected to the opposite electrode at the periphery of the substrate via the flat section, and thus electrical connection between these opposite electrode can be ensured.

In the discontinuity of the present invention, both the lower insulating layer and the upper insulating layer may have the discontinuity, or only the upper insulating layer among the upper insulating layer and the lower insulating layer may have the discontinuity.

BEST MODE FOR CARRYING OUT THE INVENTION

Figure 22:
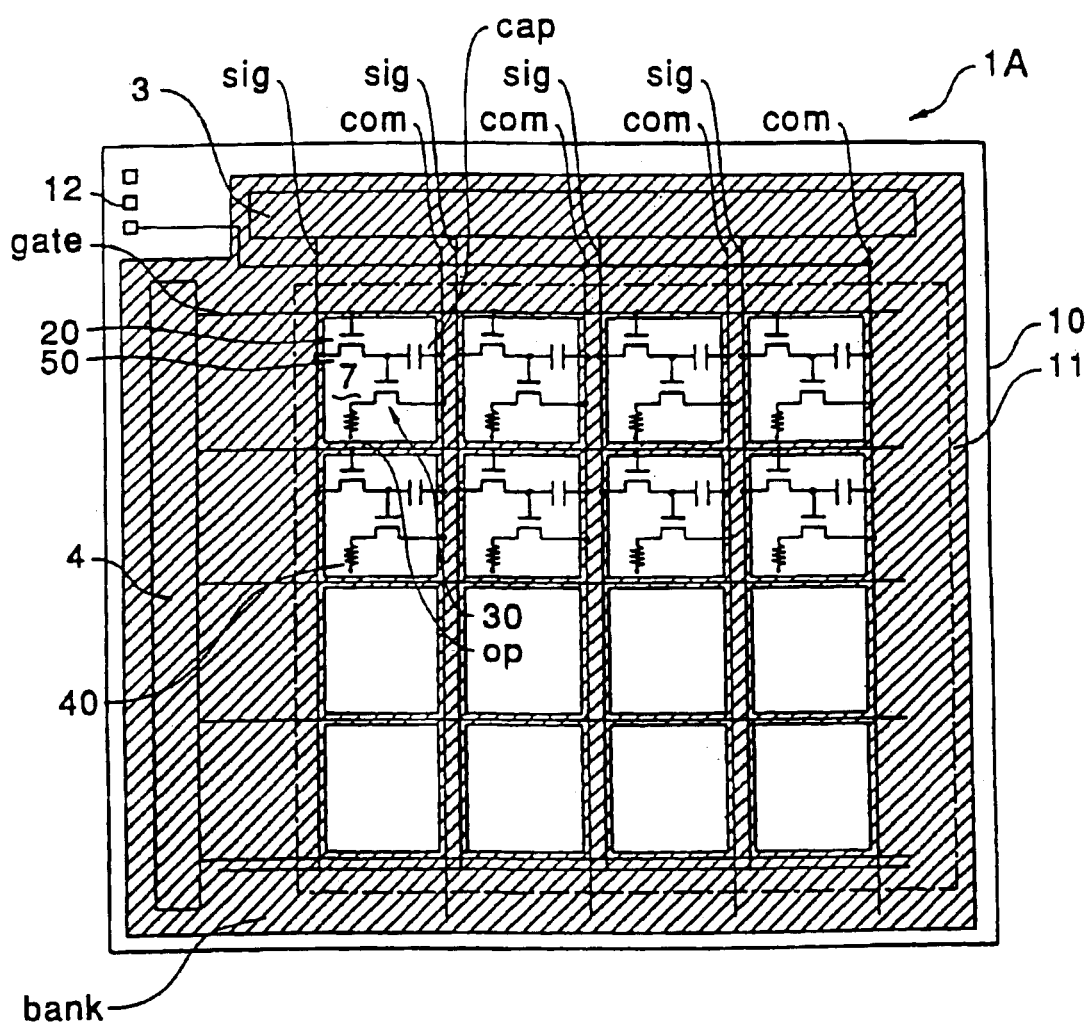
FIG. 22 is a schematic block diagram of an overall layout of a conventional active matrix display device or an active matrix display device in accordance with a comparative embodiment of the present invention.
Figure 23:
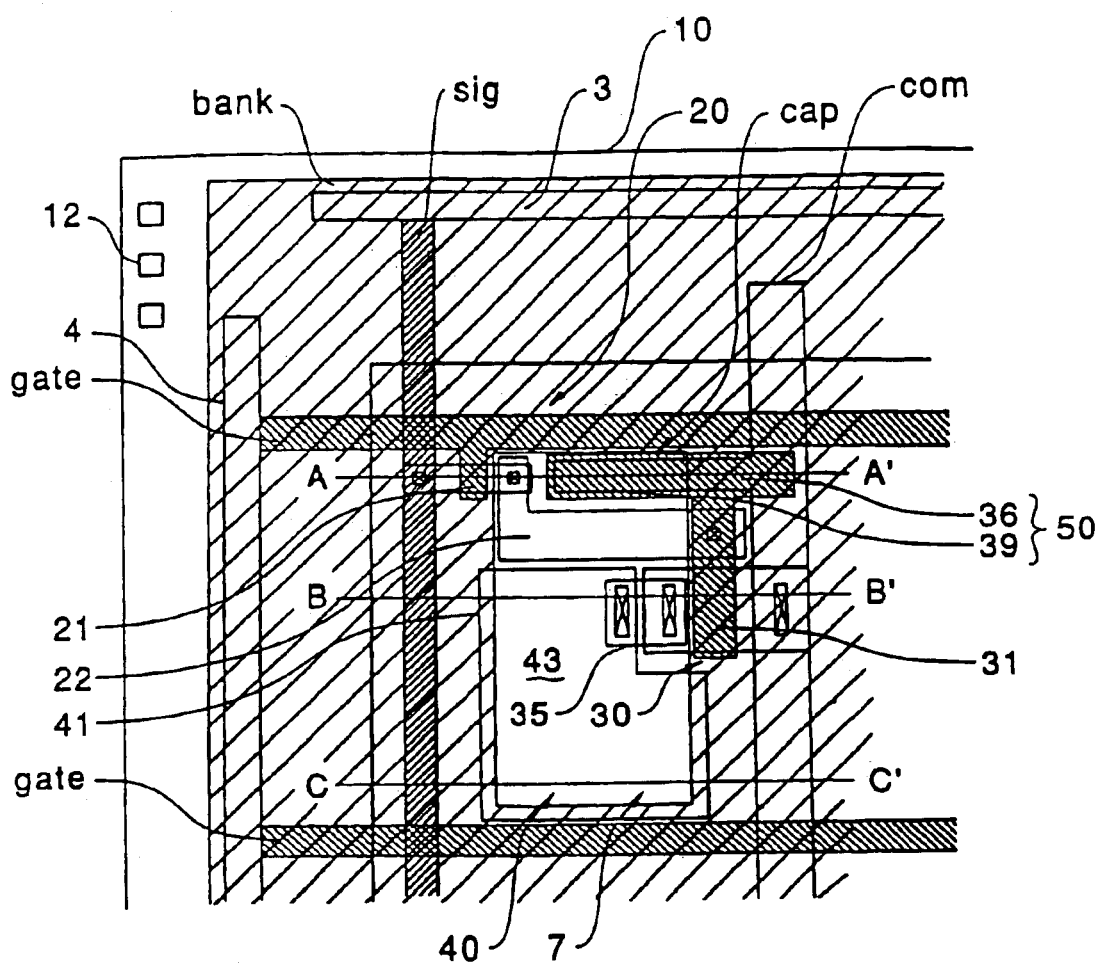
FIG. 23 is a plan view of a pixel of the active matrix display device shown in FIG. 22.
Figure 24A:
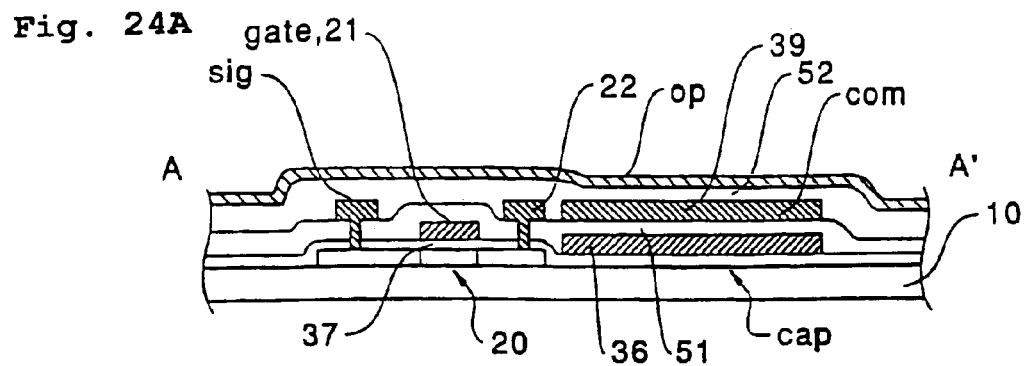
FIGS. 24(A), 24(B) and 24(C) are cross-sectional views taken from line A–A', B–B', and C–C', respectively, in FIG. 23.
Figure 24B:
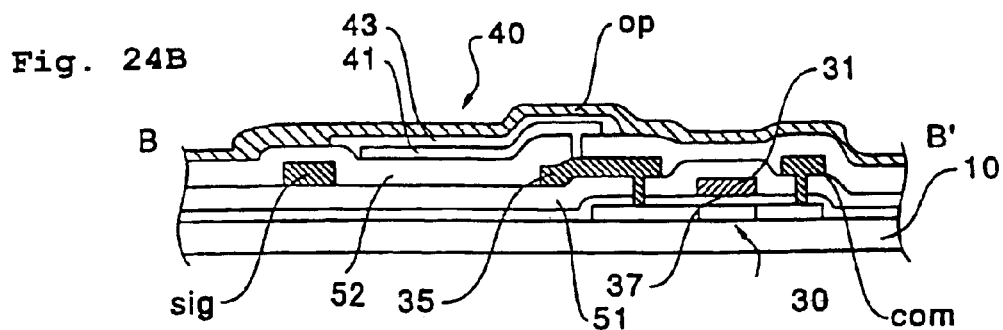
Figure 24C:
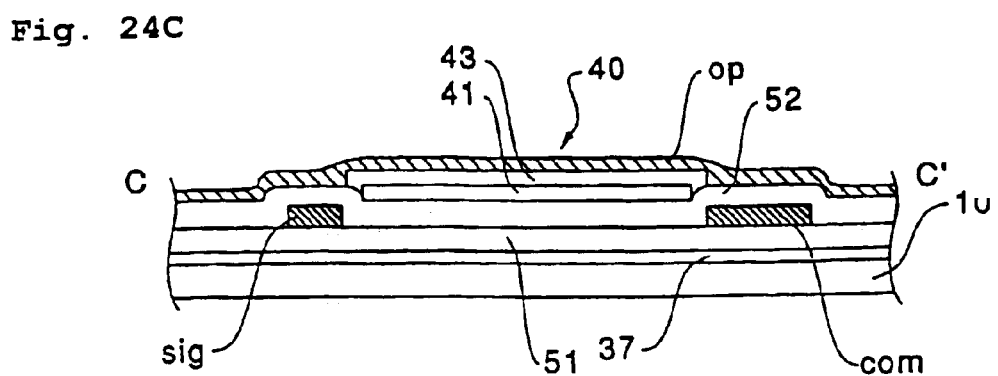
Figure 25A:
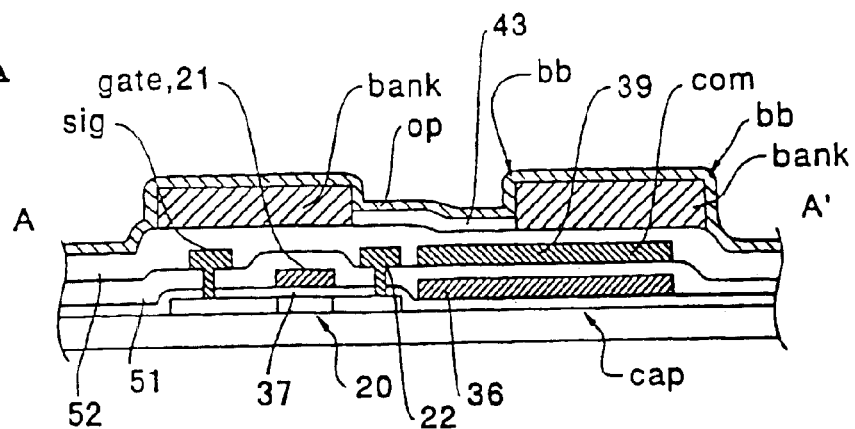
FIGS. 25(A), 25(B) and 25(C) are cross-sectional views of an active matrix display device in accordance with a comparative embodiment at positions corresponding to line A–A', B–B', and C–C', respectively, in FIG. 23.
Figure 25B:
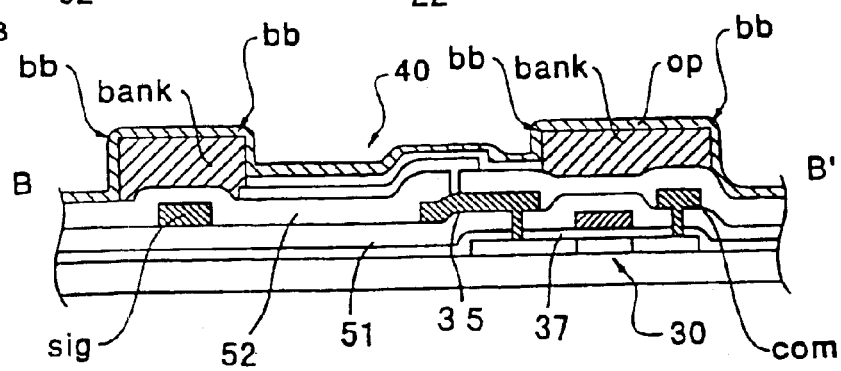
Figure 25C:
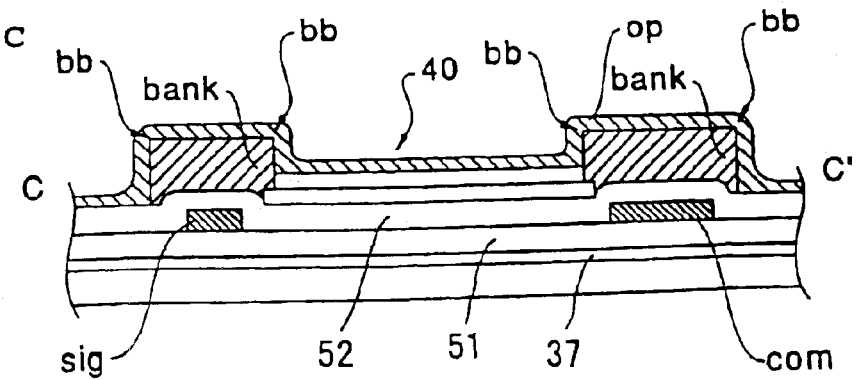

Embodiments of the present invention will now be described with reference to the drawings. Parts having the same functions as in FIGS. 22 and 25 are referred with the same numerals.

First Embodiment (Overall Configuration)

Figure 1:
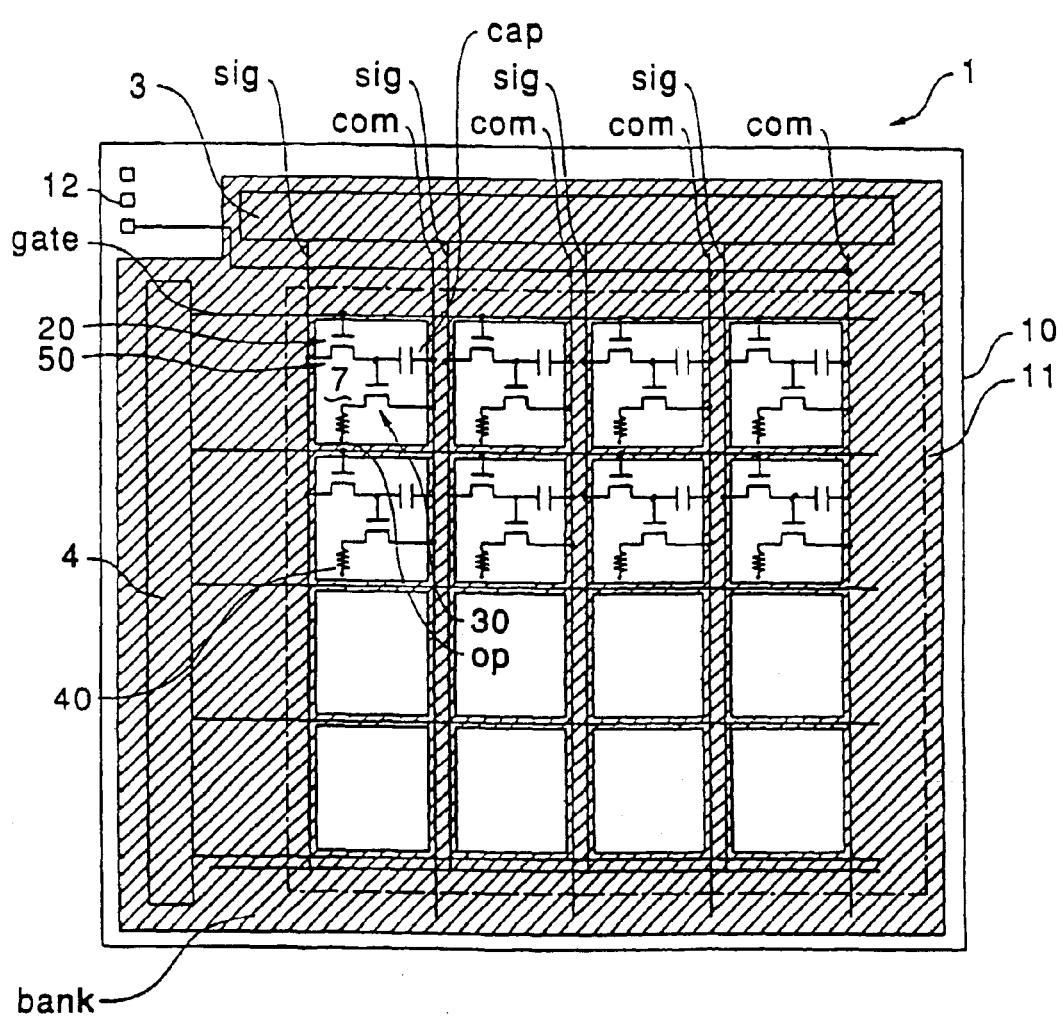
FIG. 1 is a schematic block diagram of an overall layout of an active matrix display device in accordance with a first embodiment of the present invention.
Figure 2:
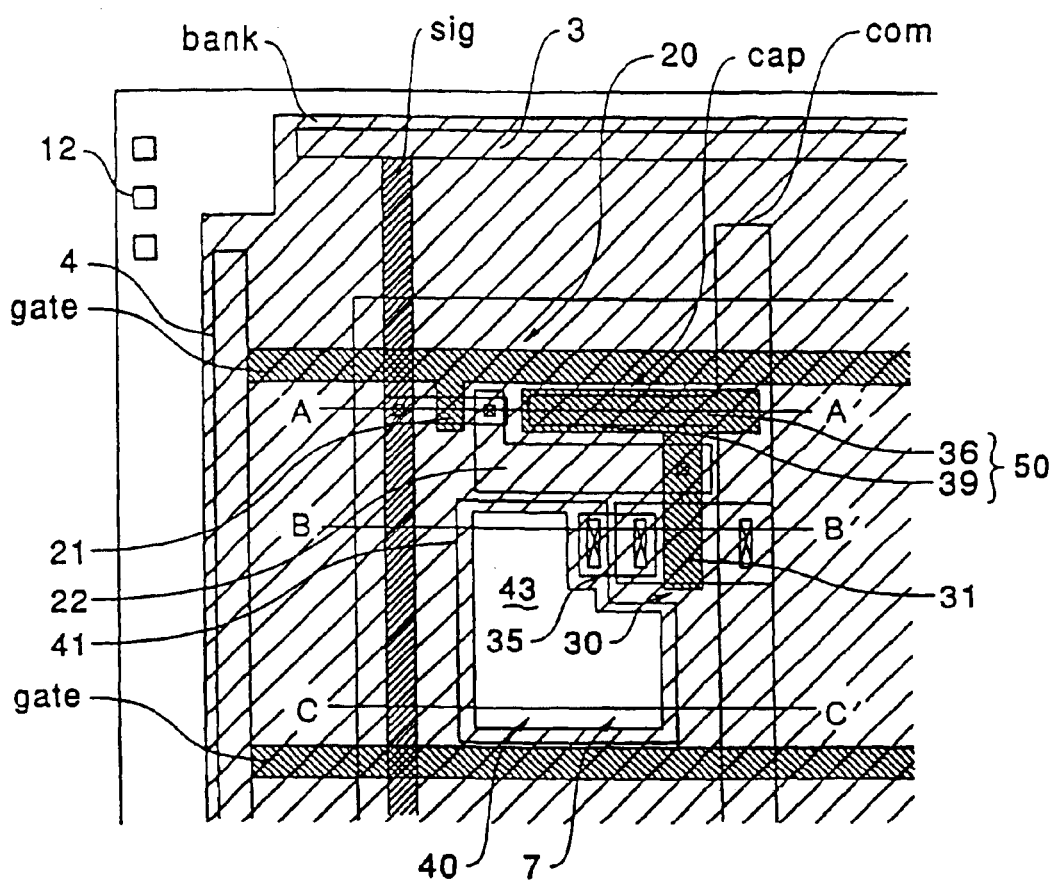
FIG. 2 is a plan view of a pixel of the active matrix display device shown in FIG. 1.
Figure 3A:
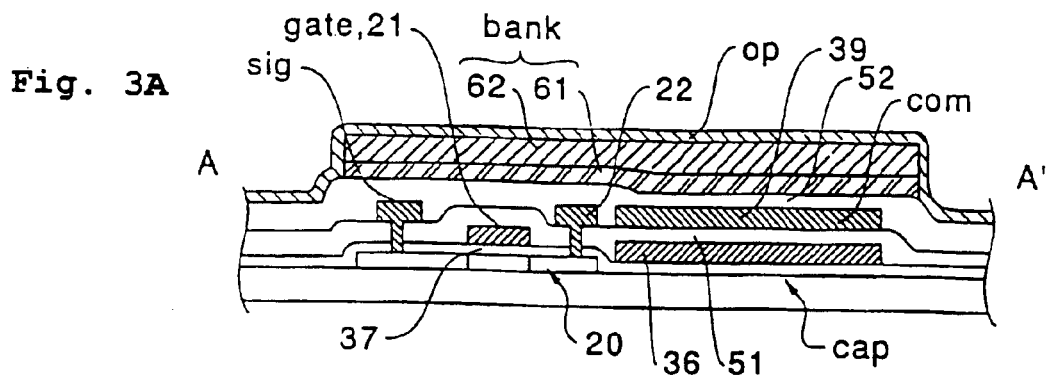
FIGS. 3(A), 3(B) and 3(C) are cross-sectional views taken from line A–A', B–B', and C–C', respectively, in FIG. 2.
Figure 3B:
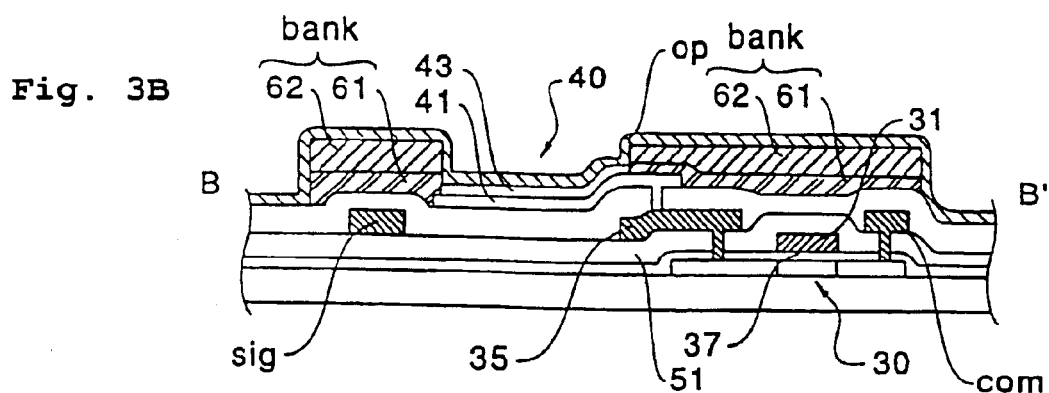
Figure 3C:
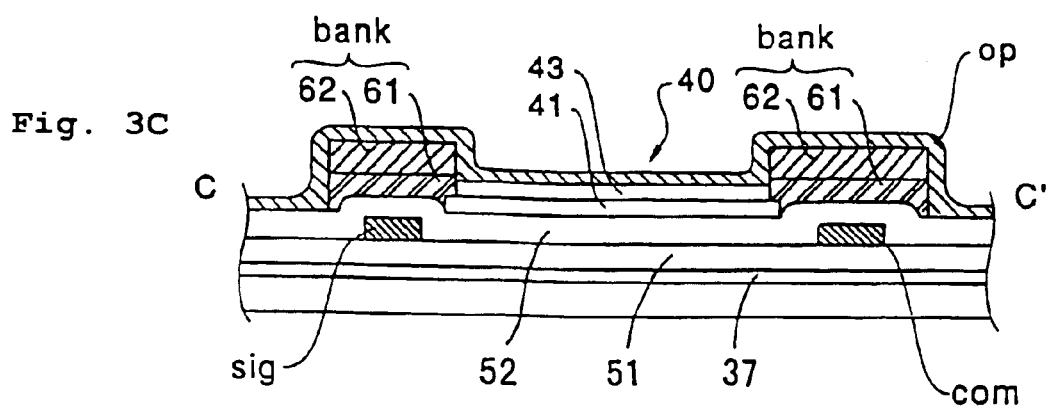

FIG. 1 is a schematic block diagram of an overall layout of an active matrix display device in accordance with the present invention. FIG. 2 is a plan view of a pixel extracted therefrom. FIGS. 3(A), 3(B) and 3(C) are cross-sectional views taken from line A–A', B–B', and C–C', respectively, in FIG. 2.

In the active matrix display device 1 shown in FIG. 1, the central portion of a transparent substrate 10 as a base is used as a display section 11. Among a periphery of the transparent substrate 10, a data line driving circuit 3 that outputs image signals is provided on the ends of data lines sig, whereas a scanning line driving circuit 4 that outputs scanning signals is provided on the ends of scanning lines gate.

In these driving circuits 3 and 4, an n-TFT and a p-TFT form a complementary TFT, and many complementary TFTs form a shift resistor circuit, a level shifter circuit, and an analog switch circuit. In the display section 11, like in an active matrix substrate of an active matrix liquid crystal display device, a plurality of scanning lines gate, a plurality of data lines sig extending perpendicular to the extending direction of the scanning lines gate, and a plurality of pixels 7 formed in a matrix by the data lines sig and the scanning lines gate are provided on the transparent substrate 10.

Each pixel 7 is provided with a conduction control circuit 50 that supplies scanning signals through a scanning line gate, and a thin film luminescent device 40 emitting light on the basis of image signals supplied from a data line sig through the conduction control circuit 50. In this embodiment, the conduction control circuit 50 includes a first TFT 20 that supplies a scanning signal to a gate electrode through a scanning line gate, a holding capacitor cap for holding an image signal supplied from a data line sig through the first TFT 20, and a second TFT 30 that supplies the image signal held in the holding capacitor cap to the gate electrode. The second TFT 30 and the thin film luminescent device 40 are connected in series between an opposite electrode op and a common feed line com. The holding capacitor cap may be formed between the opposite electrode op and the scanning line gate, in addition to between the opposite electrode op and the common feed line com.

As shown in FIGS. 2, 3(A), and 3(B), in each pixel of the active matrix display device 1 having such a configuration, the first TFT 20 and the second TFT 30 are formed using islands of semiconductive films (silicon films).

In the first TFT 20, a gate electrode 21 is formed as a part of the scanning line gate. In the first TFT 20, one of the source and drain regions is electrically connected to the data line sig via a contact hole in a first insulating film 51, whereas the other is electrically connected to a drain electrode 22. The drain electrode 22 extends towards the region of the second TFT 30, and the extended section is electrically connected to a gate electrode 31 of the second TFT 30 via a contact hole in the first insulating film 51.

One of the source and drain regions of the second TFT 30 is electrically connected to a relay electrode 35, simultaneously formed with the data line sig, via a contact hole in the first insulating film 51, and the relay electrode 35 is electrically connected to a transparent pixel electrode 41, formed of an indium tin oxide (ITO) film in the thin film luminescent device 40, via a contact hole in a second insulating film 52.

As shown in FIGS. 2, 3(B), and 3(C), pixel electrodes 41 are independently formed in individual pixels 7. An organic semiconductive film 43 formed of polyphenylene vinylene (PVV) or the like and an opposite electrode op formed of a metal film such as lithium-containing aluminum or calcium are deposited above each pixel electrode 41, in that order, to form a thin film luminescent device 40. Although an organic semiconductive film 43 is formed on each pixel in this embodiment, a stripe organic semiconductive film 43 will be formed over a plurality of pixels 7 in some cases, as will be described below. The opposite electrode op is formed over the entire display section 11, other than the periphery of the region in which terminals 12 are formed. The terminals 12 include a terminal electrically connected to the opposite electrode op formed using a conduction (not shown in the drawing) which is simultaneously formed with the opposite electrode op.

The configuration of the thin film luminescent device 40 may be a configuration provided with a positive hole injection layer having an increased luminescent efficiency (hole injection efficiency), or a configuration provided with a positive hole injection layer and an electron injection layer.

With reference to FIGS. 2 and 3(A) again, the other of the source and drain regions of the second TFT 30 is electrically connected to the common feed line com via a contact hole of the first insulating film 51. The extension 39 of the common feed line com faces the extension 36 of the gate electrode 31 separated by the first insulating film 51 as a dielectric film to form a holding capacitor cap. In place of the common feed line com, a capacitor line formed parallel to the scanning line gate may be used to form the holding capacitor cap. Alternatively, the holding capacitor cap may be formed of the drain region of the first TFT 20 and the gate electrode 31 of the second TFT 30.

In such an active matrix display device 1, when the first TFT 20 turns on by selection of a scanning signal, an image signal from the data line sig is applied to the gate electrode 31 of the second TFT 30 via the first TFT 20 and simultaneously stored in the holding capacitor cap via the first TFT 20. When the second TFT 30 turns on, a voltage is applied between the opposite electrode op as a negative electrode and the pixel electrode 41 as a positive electrode. When the voltage exceeds the threshold voltage, a current (a driving current) flowing in the organic semiconductive film 43 steeply increases. Thus, the luminescent device 40 emits light as an electroluminescent device or an LED device. Light from the luminescent device 40 is reflected by the opposite electrode op, passes through the transparent pixel electrode 41, and emerges from the transparent substrate 10. Since the driving current that performs such luminescence flows in a current passage including the opposite electrode op, the organic semiconductive film 43, the pixel electrode 41, the second TFT 30, and the common feed line com, the current stops when the second TFT 30 turns off. The holding capacitor cap, however, holds the gate electrode of the second TFT 30 at a potential corresponding to the image signal; hence, the second TFT 30 still turns on. Thus, a driving current continues to flow in the luminescent device 40 so that the pixel maintains a turned-on state. This state is held until the second TFT 30 turns off by accumulation of the next image data in the holding capacitor cap.

(Bank Layer Configuration)

In order to prevent formation of a large parasitic capacitance in the data line sig in such an active matrix display device 1 in this embodiment, as shown in FIGS. 1, 2, 3(A), 3(B), and 3(C), an insulating film (a bank layer bank, the region shaded with lines slanting downward to the left or double slanting lines at a wide pitch) which is thicker than the organic semiconductive film 43 is provided along the data line sig and the scanning line gate, and the opposite electrode op is formed above the bank layer bank. Since the second insulating film 52 and the thick bank layer bank are disposed between the data line sig and the opposite electrode op, the parasitic capacitance formed in the data line sig is significantly reduced. Thus, the load on the driving circuits 3 and 4 can be reduced, resulting in lower electrical power consumption and improved display operation.

The bank layer bank includes a lower insulating layer 61 which is formed of an inorganic material, such as a silicon oxide film or a silicon nitride film, and is thicker than the organic semiconductive film 43, and an upper insulating layer 62 which is formed on the lower insulating layer 61 and is formed of an organic material, such as a resist or a polyimide film. For example, the thicknesses of the organic semiconductive film 43, the lower insulating layer 61, and the upper insulating layer 62 are in ranges of 0.05 $\mu$m to 0.2 $\mu$m, 0.2 $\mu$m to 1.0 $\mu$m, and 1 $\mu$m to 2 $\mu$m, respectively.

In such a double-layer configuration, the upper insulating layer 62 is formed of a resist or a polyimide film which facilitates formation of a thick film; hence, only the lower insulating layer 61 can be formed of an inorganic material. Since the entire bank layer bank is not formed of an inorganic material, the formation of the inorganic film by, for example, a PECVD process does not require a long time. Thus, productivity of the active matrix display device 1 is increased.

Also, in such a double-layer configuration, the organic semiconductive film 43 comes into contact with the inorganic lower insulating layer 61, but not with the organic upper insulating layer 62. The organic semiconductive film 43 is, therefore, not damaged by the effects of the organic upper insulating layer 62, and the thin film luminescent device 40 is not subject to decreased luminescent efficiency nor decreased reliability.

As shown in FIG. 1, the bank layer bank is also formed in the peripheral region of the transparent substrate 10 (the exterior region of the display section 11); hence the data line driving circuit 3 and the scanning line driving circuit 4 are covered with the bank layer bank. The opposite electrode op must be formed at least in the display section 11, but is unnecessary in the driving circuit region. Since the opposite electrode op is generally formed by a mask sputtering process, an inaccurate alignment, such as overlap of the opposite electrode op and the driving circuits, may occur. In this embodiment, however, the bank layer bank is disposed between the lead layer of the driving circuits and the opposite electrode op; hence formation of parasitic capacitance in the driving circuits 3 and 4 is prevented even if the opposite electrode op overlaps the driving circuits. As a result, the load on the driving circuits 3 and 4 is reduced, consumption of electrical power is reduced, and high-speed display operation is achieved.

In this embodiment, the bank layer bank is also formed in the area, which overlaps the relay electrode 35 of the conduction control circuit 50, in the region that forms the pixel electrode 41. The organic semiconductive film 43 is, therefore, not formed in the area overlapping the relay electrode 35. Since the organic semiconductive film 43 is formed only at the flat section in the region that forms the pixel electrode 41, the resulting organic semiconductive film 43 has a constant thickness so that irregularities of display do not occur. If the organic semiconductive film 43 has a part having a lesser thickness, the driving current for the thin film luminescent device 40 is concentrated therein, resulting in decreased reliability of the thin film luminescent device 40. The uniform thickness in this embodiment does not cause such a problem.

If the bank layer bank is not provided in the region overlapping the relay electrode 35, the organic semiconductive film 43 emits light by a driving current between the relay electrode 35 and the opposite electrode op; however, the relay electrode 35 and the opposite electrode op inhibit emission of the light to the exterior, and the light does not contribute to display. The driving current flowing in the section which does not contribute to display is an unavailable current in view of the display.

In this embodiment, the bank layer bank is formed at the position in which an unavailable current will flow so as to prevent an unavailable current flowing in the common feed line com. Thus, the width of the common feed line com can be reduced. As a result, the luminescent area, which contributes to improved display performance, such as luminance and contrast, can be increased.

When the bank layer bank is formed of a black resist, the bank layer bank functions as a black matrix which improves the quality of display, such as contrast. In the active matrix display device 1 of this embodiment, the opposite electrode op is formed on the entire pixel 7 at the front face of the transparent substrate 10; hence light reflected by the opposite electrode op causes decreased contrast. When the bank layer bank that prevents the formation of the parasitic capacitance is formed of a black resist, the bank layer bank also functions as a black matrix which shields the light reflected by the opposite electrode op and contributes to high contrast.

(Method for Making Active Matrix Display Device)

Since the resulting bank layer bank surrounds the region that forms the organic semiconductive film 43, the layer can prevent bleeding of a discharged solution outside when the organic semiconductive film 43 is formed by discharging a liquid material (discharging solution) through an ink-jet head in the production process of the active matrix display device. In the following method of making the active matrix display device 1, the steps of making the first TFT 20 and the second TFT 30 on the transparent substrate 10 are substantially the same as the steps for making the active matrix substrate of the active matrix liquid crystal display device; hence only the outline thereof will be briefly described with reference to FIGS. 3(A), 3(B), and 3(C).

First, an underlying protective film (not shown in the drawing) formed of a silicon oxide film with a thickness of approximately 2,000 to 5,000 angstroms is formed, if necessary, on a transparent substrate 10 by a plasma enhanced CVD using tetraethoxysilane (TEOS) and gaseous oxygen as material gases. A semiconductive film formed of an amorphous silicon film with a thickness of approximately 300 to 700 angstroms is formed on the underlying protective film by a plasma enhanced CVD. The amorphous silicon semiconductive film is subjected to a crystallization step, such as a laser annealing step or a solid phase deposition step, so that the semiconductive film is crystallized to form a polysilicon film.

The semiconductive film is patterned to form islands of semiconductive films, and then a gate insulating film 37 formed of a silicon oxide or silicon nitride film with a thickness of approximately 600 to 1,500 angstroms is formed thereon by a plasma enhanced CVD using tetraethoxysilane (TEOS), gaseous oxygen and the like as material gases.

Next, a conductive film formed of a metal film, such as aluminum, tantalum, molybdenum, titanium, or tungsten, is formed by a sputtering process, and is patterned to form gate electrodes 21 and 31 and an extension 36 of the gate electrode 31 (a gate electrode forming step). This step also forms a scanning line gate.

In such a state, a high concentration of phosphorus ions are implanted to source and drain regions by self-alignment with respect to the gate electrodes 21 and 31. The section which is not doped with the impurity functions as a channel region.

After forming a first insulating interlayer 51 and then forming contact holes, a data line sig, a drain electrode 22, a common feed line com, an extension 39 of the common feed line com, and a relay electrode 35 are formed. As a result, a first TFT 20, a second TFT 30, and a holding capacitor cap are formed.

Next, a second insulating interlayer 52 is formed and a contact hole is formed at the position corresponding to the relay electrode 35 of the insulating interlayer. An ITO film is formed on the entire second insulating interlayer 52 and is patterned, and then a pixel electrode 41, which is electrically connected to the source and drain regions of the second TFT 30 via the contact hole, is formed in each pixel 7.

An inorganic film (that forms a lower insulating layer 61) is formed on the front face of the second insulating film 52 by a PECVD process, and then a resist (upper insulating layer 62) is formed along the scanning line gate and the data line sig. The inorganic film is patterned through the resist as a mask to form a lower insulating layer 61. Since the lower insulating layer 61 is thin, overetching does not occur when the lower insulating layer 61 is formed by such a patterning process. Thus, the pixel electrode 41 is not damaged.

After such an etching step, the inorganic film forms the lower insulating layer 61 along the scanning line gate and the data line sig. As a result, a double-layered bank layer bank including the lower insulating layer 61 and the upper insulating layer 62 is formed. In this step, the resist section remaining along the data line sig has a large width so as to cover the common feed line com. Thus, a region that forms the organic semiconductive film 43 in the luminescent device 40 is surrounded with the bank layer bank.

Organic semiconductive films 43 corresponding to R, G, and B are formed in regions in a matrix bounded by the bank layer bank by an ink-jet process. A liquid material (a precursor or a discharging solution) that forms the organic semiconductive film 43 is discharged in the inner region of the bank layer bank through an ink-jet head and fixed in the inner region of the bank layer bank to form the organic semiconductive film 43. Since the upper insulating layer 62 of the bank layer bank is formed of a resist or a polyimide film, it has water-repellent properties. In contrast, the precursor of the organic semiconductive film 43 contains a hydrophilic solution; hence, the region that forms the organic semiconductive film 43 is reliably defined by the bank layer bank. Since the solution does not bleed out of the adjacent pixels 7, the organic semiconductive film 43 can be formed only in the predetermined region.

In this step, since the precursor discharged from the ink-jet head forms a convex surface with a thickness of approximately 2 $\mu$m to 4 $\mu$m by the surface tension, the bank layer must have a thickness of approximately 1 $\mu$m to 3 $\mu$m. Although the precursor discharged from the ink-jet head comes into contact with the upper insulating layer 62 in this state, the solvent in the precursor is removed by heat treatment at 100° C. to 150° C. Thus, the thickness of the organic semiconductive film 43 fixed in the inner region of the bank layer bank is in a range of approximately 0.05 $\mu$m to 0.2 $\mu$m. The organic semiconductive film 43 no longer is in contact with the upper insulating layer 62.

When the bank layer bank has a height of 1 $\mu$m or more, the bank layer bank sufficiently functions as a barrier even if the bank layer bank does not have water-repellent properties. Such a thick bank layer bank can define the region that forms the organic semiconductive film 43 when the film is formed by a coating process in place of the ink-jet process.

Next, an opposite electrode op is formed on substantially the entire transparent substrate 10.

According to the method, organic semiconductive films 43 can be formed at predetermined positions corresponding to R, G, and B by an ink-jet process; hence a full color active matrix display device 1 can be made with high productivity.

Although TFTs are also formed in the data line driving circuit 3 and the scanning line driving circuit 4 shown in FIG. 1, these TFTs can be formed by completely or partly employing the above steps of forming the TFT in the pixel 7. Thus, the TFTs in the driving circuits are also formed in the same interlayer in which TFTs for pixels 7 are formed. In combinations for the first TFT 20 and the second TFT 30, combinations of an n-type and an n-type, of a p-type and a p-type, and of an n-type and a p-type are allowable. Since all the combinations of TFTs can be produced by any well-known method, description thereof will be omitted.

Second Embodiment

Figure 4A:
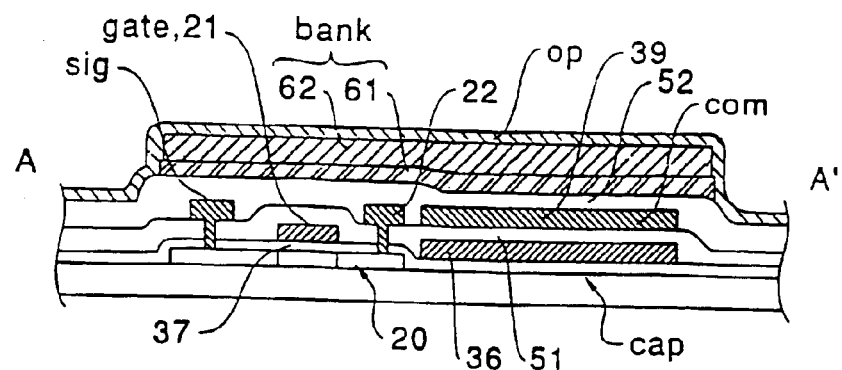
FIGS. 4(A), 4(B) and 4(C) are cross-sectional views of active matrix display devices in accordance with a second embodiment and a third embodiment of the present invention at positions corresponding to line A–A', B–B', and C–C', respectively, in FIG. 2.
Figure 4B:
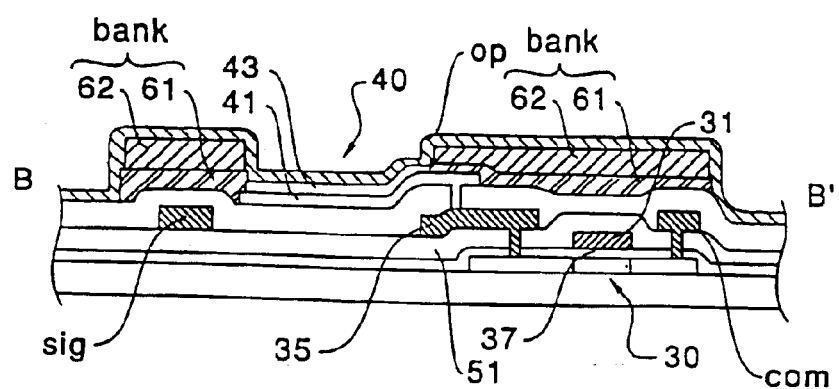
Figure 4C:
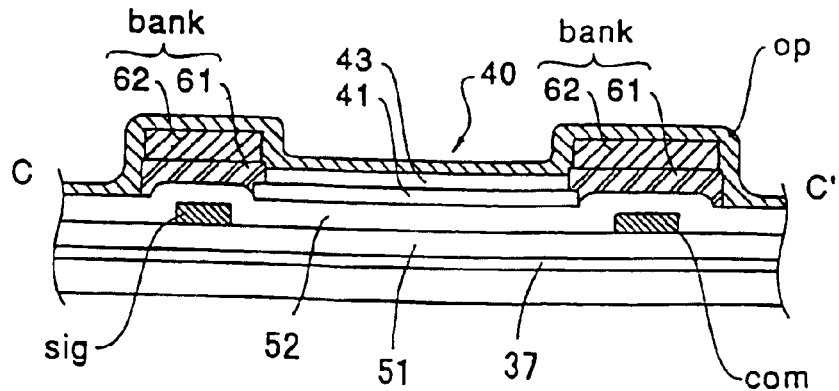

FIGS. 4(A), 4(B) and 4(C) are cross-sectional views of an active matrix display device in accordance with this embodiment at positions corresponding to line A–A', B–B', and C–C', respectively, in FIG. 2. This embodiment has a basic configuration which is substantially the same as that of the first embodiment; hence, the same symbols are assigned for the same parts, without detailed description thereof. Since the region that forms the bank layer bank in the active matrix display device of this embodiment is the same as that in the first embodiment, FIGS. 1 and 2 are also referred to in the following description.

In order to prevent formation of a large parasitic capacitance in a data line sig, also, in this embodiment, as shown in FIGS. 1, 2, 4(A), 4(B), and 4(C), an insulating film (a bank layer bank, the region shaded with lines slanting downward to the left or double slanting lines at a wide pitch) which is thicker than an organic semiconductive film 43 is provided along the data line sig and a scanning line gate, and an opposite electrode op is formed above the bank layer bank.

As in the first embodiment, the bank layer bank includes an inorganic lower insulating layer 61, such as a silicon oxide or silicon nitride film which is thicker than the organic semiconductive film 43, and an upper organic insulating film 62, such as a resist or a polyimide film, formed on the lower insulating layer 61.

In this embodiment, as shown in FIGS. 4(A), 4(B) and 4(C), the upper organic insulating film 62 has a smaller width than that of the lower inorganic insulating film 61 and is formed on the inner region of the lower insulating layer 61. For example, the overlapping width of the upper insulating layer 62 and the pixel electrode 41 is in a range of 1 $\mu$m to 3 $\mu$m, and a gap between an edge of the lower insulating layer 61 and the corresponding edge of the upper insulating layer 62 is in a range of 1 $\mu$m to 5 $\mu$m. Thus, the bank layer bank has a double-layered configuration in which the underlying insulating film 61 and the upper insulating layer 62 having different widths are deposited.

The upper insulating layer 62 is formed of a resist or a polyimide film, which facilitates formation of a thick film, in such a double-layered configuration, and only the lower insulating layer 61 is formed of an inorganic material. The process, such as a PECVD process, that forms the inorganic film does not require a long deposition time, unlike the process that forms a thick bank layer bank which is entirely formed of an inorganic material. Thus, the active matrix display device 1 can be manufactured with high productivity.

In such a double-layered configuration, the organic semiconductive film 43 comes into contact with the lower insulating layer 61, but not with the upper insulating layer 62. Furthermore, the upper insulating layer 62 is formed on the inner portion of the lower insulating layer 61 to avoid the contact of the organic semiconductive film 43 with the upper insulating layer 62. Thus, the upper organic insulating film 62 does not cause deterioration of the organic semiconductive film 43 which would result in decreased luminescent efficiency and decreased reliability of the thin film luminescent device 40.

The other configurations are the same as those in the first embodiment. Each pixel 7 is surrounded with the bank layer bank. Organic semiconductive films 43 can be formed in predetermined positions corresponding to R, G, and B by an ink-jet process; hence, a full color active matrix display device 1 can be manufactured with high productivity, as in the first embodiment.

In the formation of the bank layer bank having such a configuration, an inorganic film (that forms a lower insulating layer 61) is formed on the front face of the second insulating film 52 by a PECVD process, the lower insulating layer 61 is formed along the scanning line gate and the data line sig, and then a resist used for the patterning is removed. Next, a resist or a polyimide film with a thickness which is smaller than that of the lower insulating layer 61 is formed thereon as the upper insulating layer 62. Since the lower insulating layer 61 is thin, overetching does not occur when the lower insulating layer 61 is formed by patterning. Thus, the pixel electrode 41 is not damaged.

Third Embodiment

An active matrix display device 1 in this embodiment has the same configuration as that in the second embodiment, but a material for the bank layer bank is different. Thus, the same symbols are assigned for the same parts, without detailed description thereof. FIGS. 1, 2, 4(A), 4(B) and 4(C) are also referred to in the following description, as in the second embodiment.

In order to prevent formation of a large parasitic capacitance in a data line sig, as shown in FIGS. 1, 2, 4(A), 4(B), and 4(C), an insulating film (a bank layer bank, the region shaded with lines slanting downward to the left or double slanting lines at a wide pitch) which is thicker than an organic semiconductive film 43 is provided along the data line sig and a scanning line gate, and an opposite electrode op is formed above the bank layer bank.

The bank layer bank includes an inorganic lower insulating layer 61, such as a silicon nitride film, which is thicker than the organic semiconductive film 43, and an upper inorganic insulating film 62, such as a silicon oxide film, formed on the lower insulating layer 61. Since the organic semiconductive film 43 does not come into contact with any other organic material in such a double-layered configuration, it will not be deteriorated by the effects of the other organic material. Thus, a decrease in luminescent efficiency and reliability does not occur in the thin film luminescent device 40.

The upper organic insulating film 62 has a smaller width than that of the lower inorganic insulating film 61 and is formed on the inner region of the lower insulating layer 61. Thus, the bank layer bank has a double-layered configuration in which the underlying insulating film 61 and the upper insulating layer 62 having different widths are deposited.

In the formation of the bank layer bank having such a configuration, inorganic films (a silicon nitride film and a silicon oxide film) that form the lower insulating layer 61 and the upper insulating layer 62 are formed in that order, and the upper insulating layer 62 is patterned. Since the lower insulating layer 61 functions as an etching stopper, slight overetching will not damage the pixel electrode 41. After the patterning, the lower insulating layer 61 is patterned. Since a single layer of the lower insulating layer 61 is etched, the etching is readily controlled and overetching which would damage the pixel electrode 41 does not occur.

The other configurations are the same as those in the first and second embodiments. Each pixel 7 is, therefore, surrounded with the bank layer bank. Organic semiconductive films 43 can be formed in predetermined positions corresponding to R, G, and B by an ink-jet process; hence, a full color active matrix display device 1 can be manufactured with high productivity, as in the first embodiment.

Modifications of First, Second, and Third Embodiments

Since the bank layer bank is formed along the data line sig and the scanning line gate in the above embodiments, the bank layer bank bounds pixels 7 in a matrix. The bank layer bank may be formed along only the data line sig. Organic semiconductive film 43 having a striped pattern, corresponding to R, G, and B, can be formed in striped regions bounded by the bank layer bank by an ink-jet process; hence a full color active matrix display device 1 can be made with high productivity.

Figure 26:
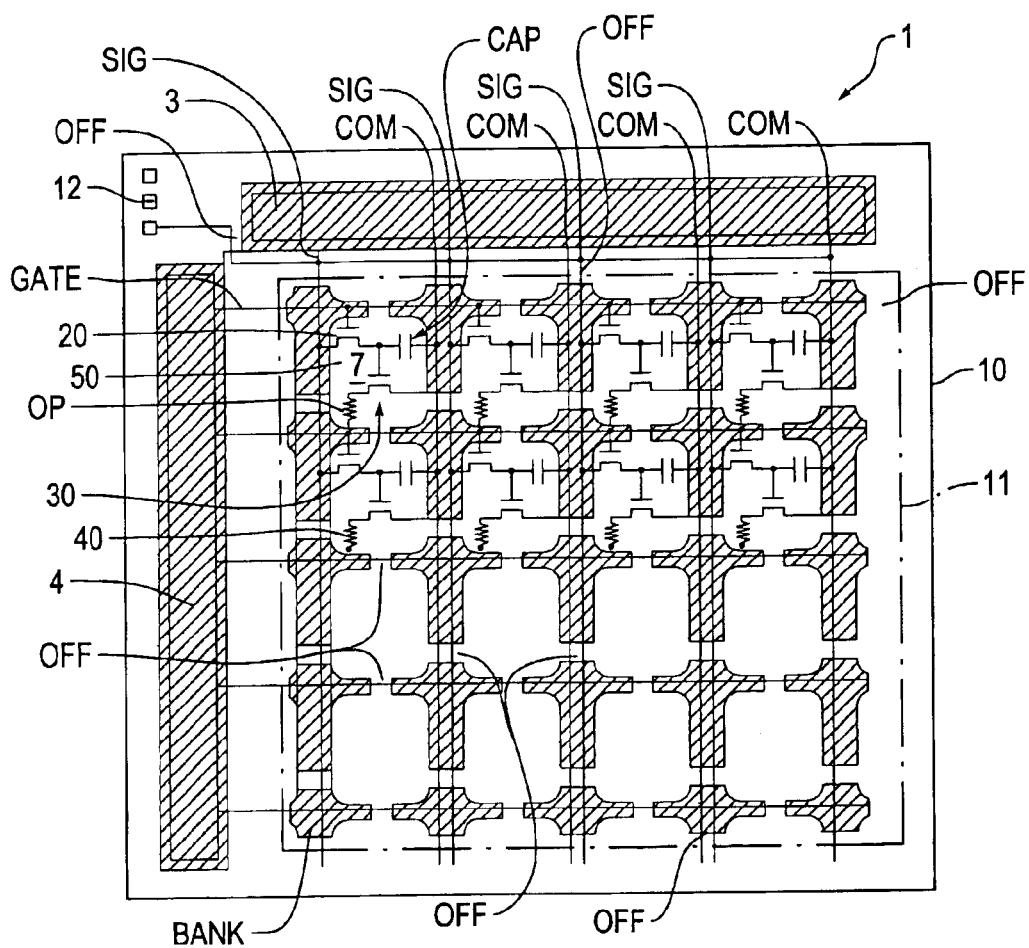
FIG. 26 is a schematic block diagram similar to that shown in FIG. 16, except that the corners of the blank are rounded.

Although the corners bounded by the bank layer bank are edged in the above embodiments, they may be rounded so that the organic semiconductive film 43 has a rounded planar shape, as shown in FIG. 26. The organic semiconductive film 43 having such a shape avoids the concentration of the driving current at the corners, hence defects, such as insufficient voltage resistance, can be prevented at the corners.

Fourth Embodiment

An active matrix display device 1 in this embodiment has a basic configuration like that in the first, second or third embodiment; hence, FIG. 1 is referred to for the description, and the same symbols are assigned for the same parts, without detailed description thereof.

Figure 5:
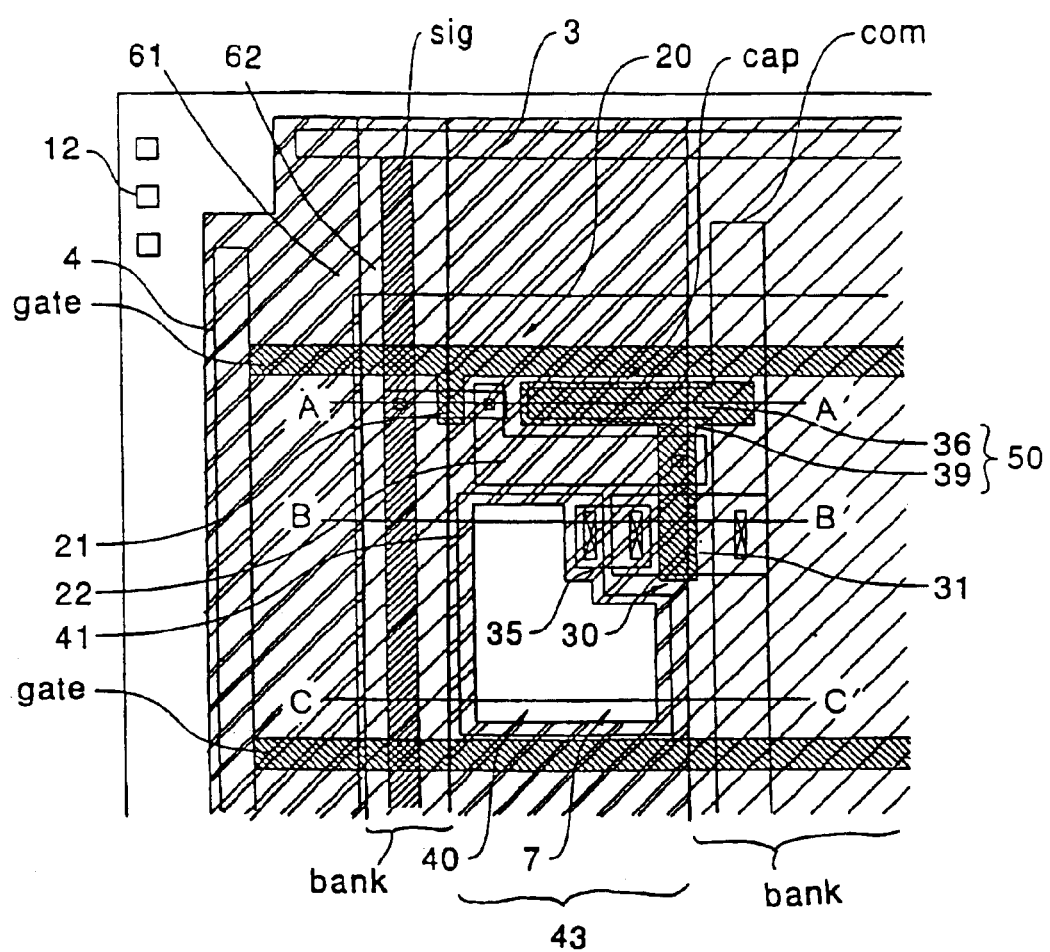
FIG. 5 is a plan view of a pixel of an active matrix display device in accordance with a fourth embodiment of the present invention.
Figure 6A:
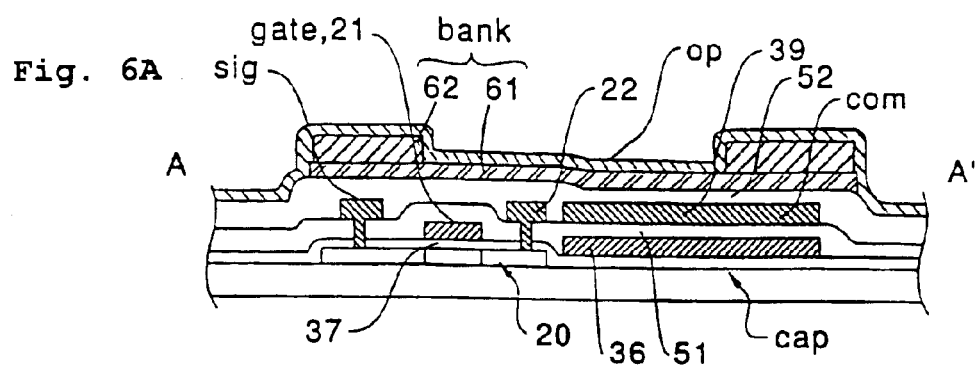
FIGS. 6(A), 6(B) and 6(C) are cross-sectional views taken from line A–A', B–B', and C–C', respectively, in FIG. 5.
Figure 6B:
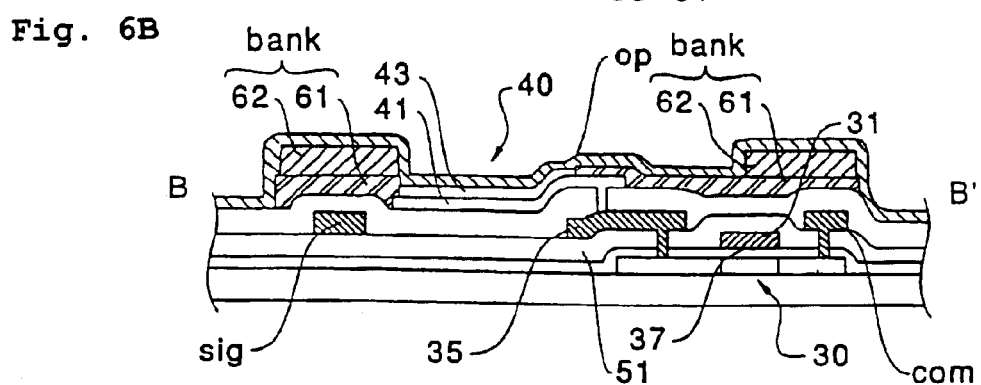
Figure 6C:
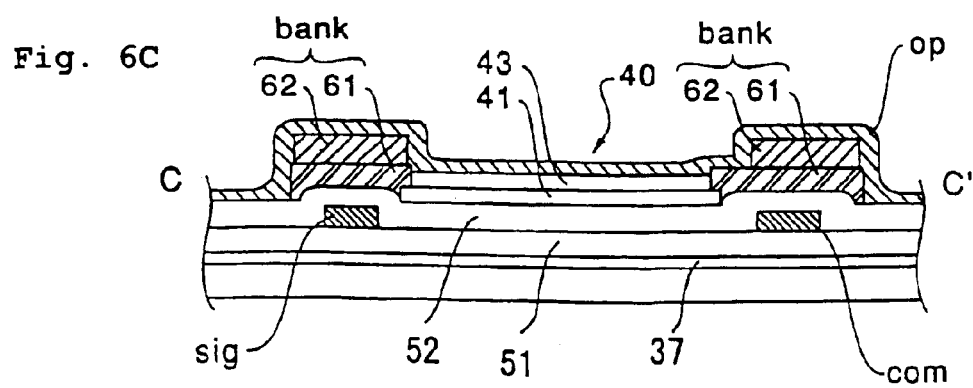

FIG. 5 is a plan view of a pixel taken from an active matrix display device of this embodiment. FIGS. 6(A), 6(B) and 6(C) are cross-sectional views taken from line A–A', B–B', and C–C', respectively, in FIG. 5.

As described below, a lower insulating layer 61 partly overlaps an upper insulating layer 62 in this embodiment so that these films have different functions. As shown in FIG. 1, also, in this embodiment, a plurality of scanning lines gate, a plurality of data lines sig extending perpendicular to the extending direction of the scanning lines gate, a plurality of common feed lines com formed parallel to the data lines sig, and a plurality of pixels 7 formed in a matrix by the data lines sig and the scanning lines gate are provided.

In this embodiment, as shown in FIGS. 5 and 6, a lower insulating layer 61 (a region shaded by double lines slanting down toward the left) is formed so as to cover an area overlapping the portion that forms a conduction control circuit 50 in the region that forms a pixel electrode 41; the data line sig; the common feed line com; and the scanning line gate. On the other hand, the upper insulating layer 62 (a region shaded by lines at a wide pitch and slanting down toward the left) is formed only on areas along the data lines sig in the region that forms the lower insulating layer 61 so as to form a striped pattern. Organic semiconductive films 43 are formed in the striped areas bounded by the upper insulating layer 62.

When the organic semiconductive films 43 having the striped pattern are formed by an ink-jet process in such a configuration, the overlapping section of the lower insulating layer 61 and the upper insulating layer 62 is used as a bank layer bank to prevent bleeding of the discharged solution. In this embodiment, the overlapping section of the lower insulating layer 61 and the upper insulating layer 62 has a thickness of 1 $\mu$m or more.

Since the second insulating film 52 and the thick bank layer bank (the lower insulating layer 61 and the upper insulating layer 62) are disposed between the data lines sig and the opposite electrode op in such a configuration, parasitic capacitance forming in the data line sig is significantly reduced. Thus, the load on the driving circuits 3 and 4 can be reduced, resulting in lower electrical power consumption and improved display operation.

Although the striped organic semiconductive films 43 are formed, an area overlapping the portion that forms a conduction control circuit 50 in the region that forms the pixel electrode 41, and a scanning line gate are covered with the upper insulating layer 62. Thus, organic semiconductive film 43 formed only on the flat section in the pixel electrode 41 contributes to luminescence. In other words, the thin film luminescent device 40 is formed only in the flat section of the pixel electrode 41. Thus, the organic semiconductive film 43 has a constant thickness and does not cause irregularities of display and concentration of a driving current. Since the lower insulating layer 61 inhibits a current flow in the section which does not contribute to display, an unavailable current does not flow in the common feed line com.

When the underlying insulating film 61 is formed of an inorganic material such as a silicon oxide film or a silicon nitride film which is thicker than the organic semiconductive film 43, and when the upper insulating layer 62 is formed of an organic material, such as a resist or a polyimide film, only the lower insulating layer 61 is formed of the inorganic material. Thus, the process, such as a PECVD process, that forms the inorganic film does not require a long deposition time, unlike the process that forms a thick bank layer bank which is entirely formed of an inorganic material. Thus, the active matrix display device 1 can be manufactured with high productivity. In such a double-layered configuration, the organic semiconductive film 43 comes into contact with the lower insulating layer 61, but not with the upper organic insulating film 62. Thus, the upper organic insulating film 62 does not cause deterioration of the organic semiconductive film 43 which results in decreased luminescent efficiency and decreased reliability of the thin film luminescent device 40.

When the lower insulating layer 61 is formed of an inorganic material, such as a silicon nitride film, which is thicker than the organic semiconductive film 43, and when the upper insulating layer 62 formed on the lower insulating layer 61 is formed of an inorganic material, such as a silicon oxide film, the organic semiconductive film 43 does not come into contact with an organic material, and thus is not deteriorated by the effects of the organic material. Thus, a decrease in the luminescent efficiency and reliability does not occur in the thin film luminescent device 40. Since the underlying insulating film 61 with a smaller width is deposited on the inner region of the lower insulating layer 61, the lower insulating layer 61 functions as an etching stopper when the upper insulating layer 62 is patterned, as described in the third embodiment.

Fifth Embodiment

Figure 7:
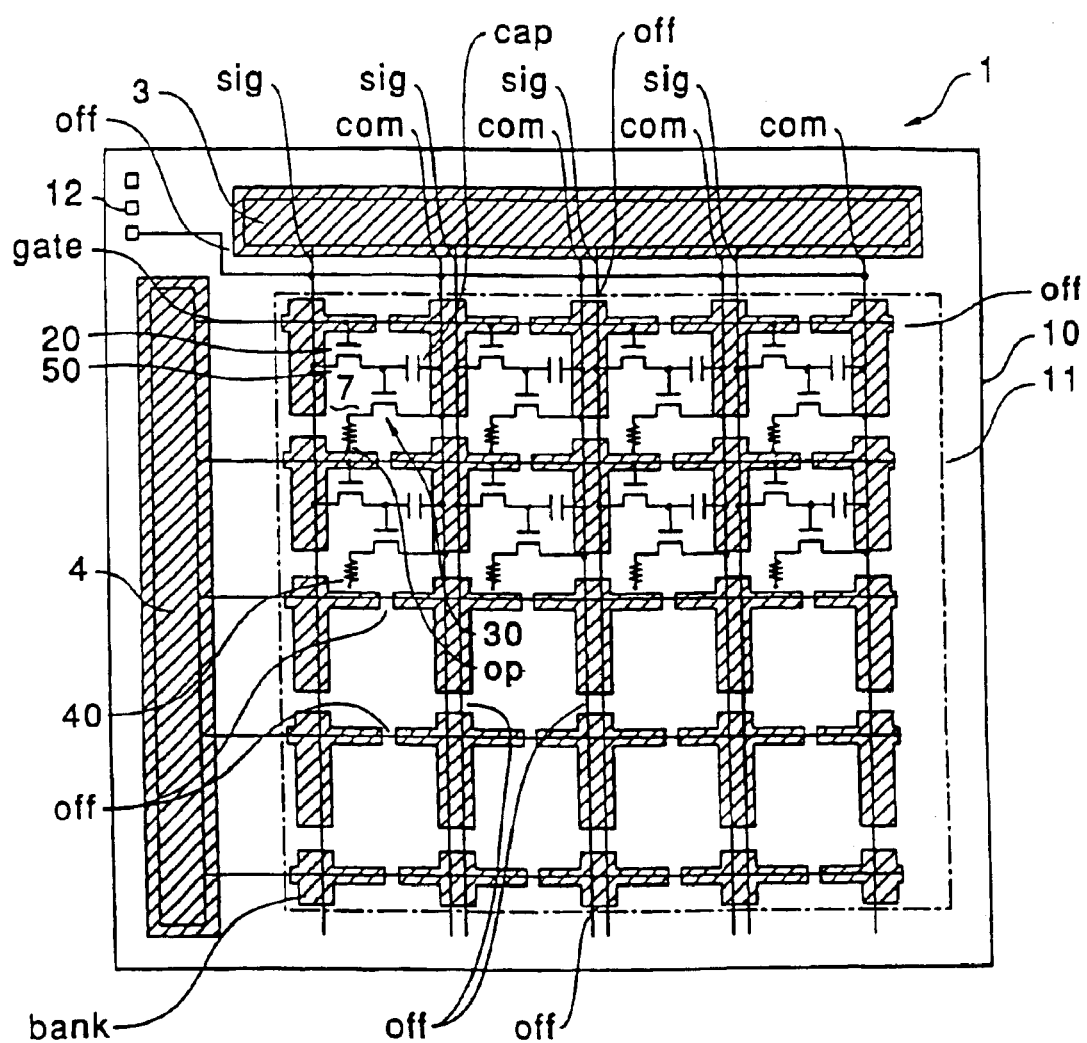
FIG. 7 is a schematic block diagram of an overall layout of an active matrix display device in accordance with a fifth embodiment of the present invention.
Figure 8:
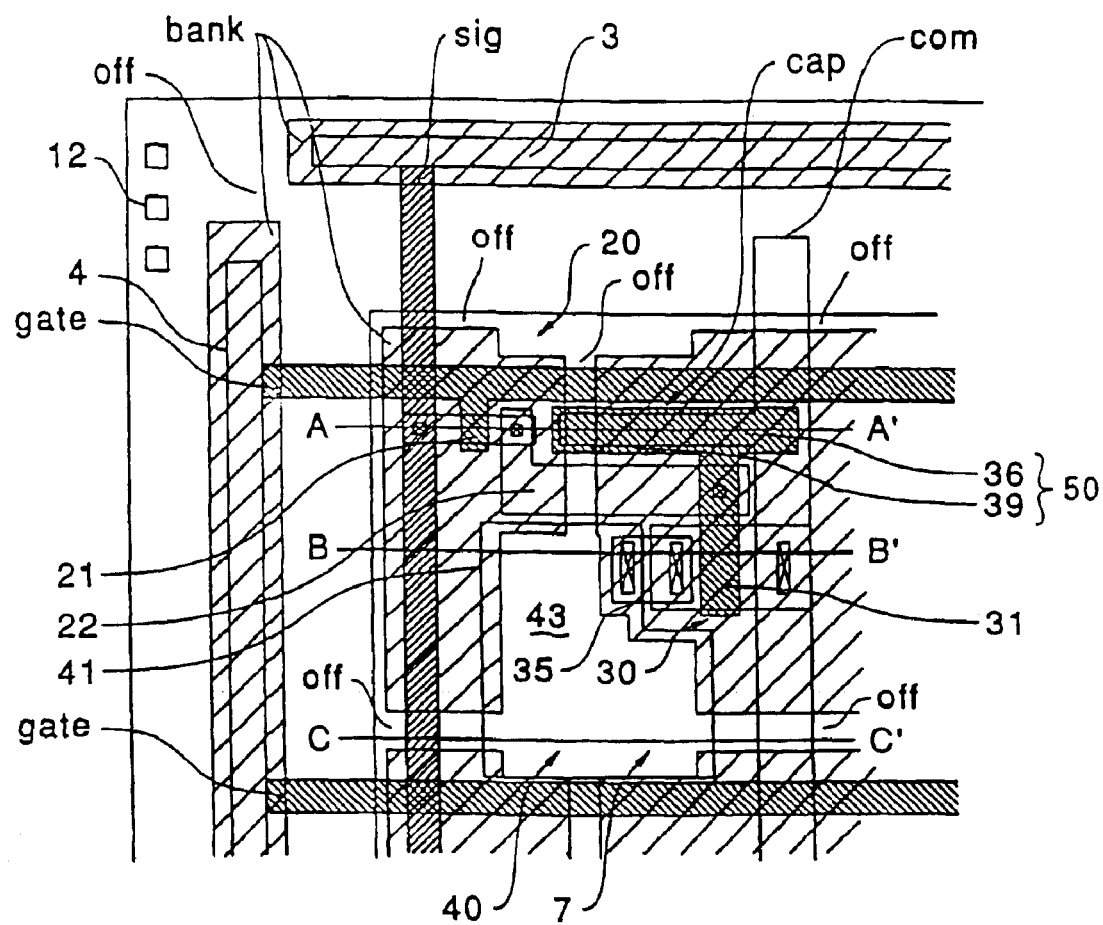
FIG. 8 is a plan view of a pixel of the active matrix display device shown in FIG. 7.
Figure 9A:
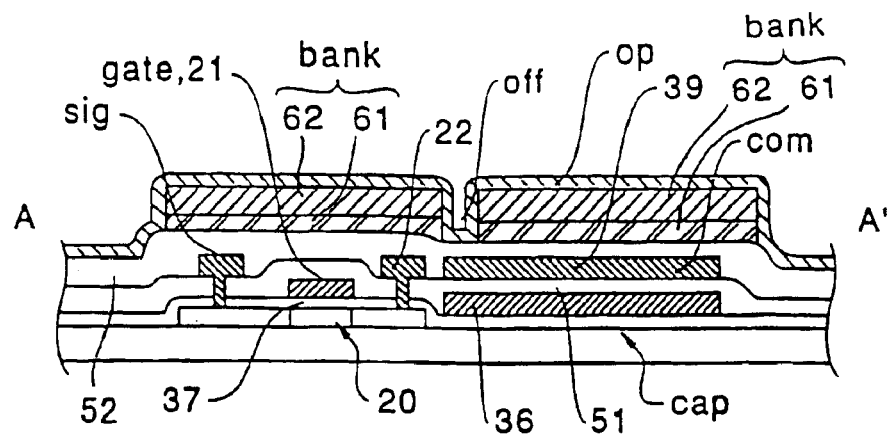
FIGS. 9(A), 9(B) and 9(C) are cross-sectional views taken from line A–A', B–B', and C–C', respectively, in FIG. 8.
Figure 9B:
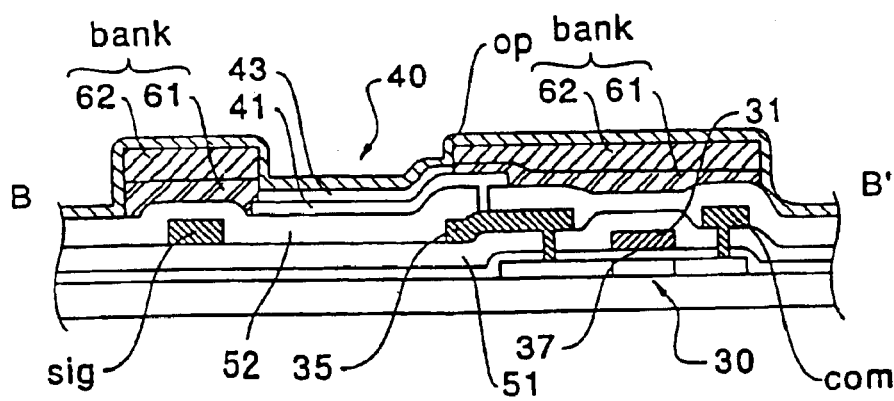
Figure 9C:
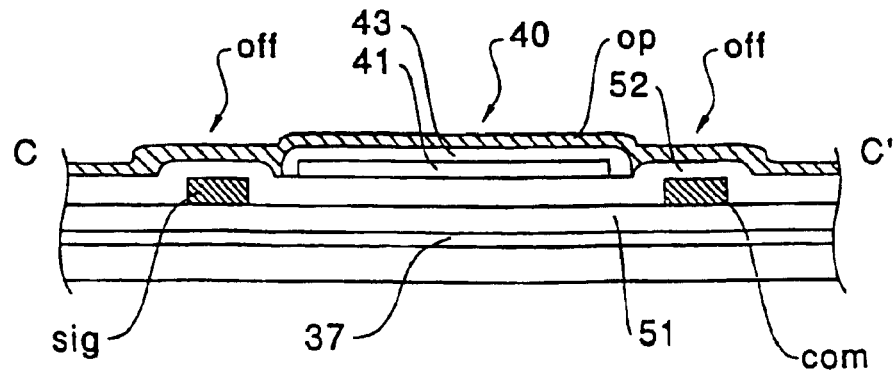

FIG. 7 is a schematic block diagram of an overall layout of an active matrix display device. FIG. 8 is a plan view of a pixel extracted therefrom. FIGS. 9(A), 9(B) and 9(C) are cross-sectional views taken from line A–A', B–B', and C–C', respectively, in FIG. 8. This embodiment has a basic configuration which is substantially the same as that of the first embodiment; hence, the same symbols are assigned for the same parts, without detailed description thereof.

Also, in this embodiment, an insulating film (a bank layer bank, the region shaded with lines slanting downward to the left or double slanting lines at a wide pitch) which is thicker than an organic semiconductive film 43, is provided along the data line sig and a scanning line gate, and an opposite electrode op is formed above the bank layer bank. Since the second insulating film 52 and the thick bank layer bank are disposed between the data lines sig and the opposite electrode op, parasitic capacitance forming in the data line sig is significantly reduced. Thus, the load on the driving circuits 3 and 4 can be reduced, resulting in lower electrical power consumption and improved display operation.

The bank layer bank includes a lower insulating layer 61 which is formed of an inorganic material, such as a silicon oxide film or a silicon nitride film, and is thicker than the organic semiconductive film 43, and an upper insulating layer 62 which is formed on the lower insulating layer 61, and is formed of an organic material, such as a resist or a polyimide film. For example, the thicknesses of the organic semiconductive film 43, the lower insulating layer 61, and the upper insulating layer 62 are in ranges of 0.05 $\mu$m to 0.2 $\mu$m, 0.2 $\mu$m to 1.0 $\mu$m, and 1 $\mu$m to 2 $\mu$m, respectively. Thus, the organic semiconductive film 43 comes into contact with the inorganic lower insulating layer 61, but not with the organic upper insulating layer 62. The organic semiconductive film 43 is, therefore, not damaged by the effects of the organic upper insulating layer 62, and the thin film luminescent device 40, as in the first embodiment, is not subject to decreased luminescent efficiency nor decreased reliability.

In the active matrix display device 1 having such a configuration, the organic semiconductive film 43 is surrounded with the bank layer bank. Thus, the opposite electrode op of each pixel 7 will be connected to the opposite electrode op of the adjacent pixel 7 over the bank layer bank as it stands. In this embodiment, discontinuities portion off (first discontinuities portion) are provided for both the lower insulating layer 61 and the upper insulating layer 62 of the bank layer bank along the data lines sig between adjacent pixels 7. Discontinuities portion off(first discontinuities portion) are also provided for both the lower insulating layer 61 and the upper insulating layer 62 of the bank layer bank along the scanning lines gate between adjacent pixels 7. Furthermore, discontinuities portion off(first discontinuities portion) are provided for both the lower insulating layer 61 and the upper insulating layer 62 of the bank layer bank at the ends of each data line sig and each scanning line gate.

Since the thick bank layer bank is not provided at each discontinuity off, the discontinuity off does not have a large step and is flat. Thus, the opposite electrode op formed at this section does not cause disconnection. The opposite electrodes op of adjacent pixels 7 are securely connected through the flat section not having a step of the bank layer bank. Accordingly, a thick insulating film (a bank layer bank) can be formed around a pixel 7 to suppress the parasitic capacitance, without disconnection of the opposite electrodes op formed on the thick insulating film (bank layer bank).

In the peripheral region of the transparent substrate 10 (the outer region of the display section 11), the data line driving circuit 3 and the scanning line driving circuit 4 are covered with the bank layer bank (the region is indicated by shading). Thus, the opposite electrode op provided above the region that forms these driving circuits is separated by the bank layer bank from the lead layer of these driving circuits. Since formation of the parasitic capacitance in the driving circuits can be prevented, the load on the driving circuits 3 and 4 can be reduced, resulting in lower electrical power consumption and improved display operation.

Furthermore, a discontinuity off(second discontinuity) is provided for both the lower insulating layer 61 and the upper insulating layer 62 of the bank layer bank between the region that forms the scanning line driving circuit 4 and the region for the data line driving circuit 3. The opposite electrode op at the side of the display section 11 and the opposite electrode op at the peripheral side of the substrate are connected through the discontinuity off of the bank layer bank, and the discontinuity off is also a flat section not having a step. Since the opposite electrode op formed at the discontinuity off does not cause disconnection, the opposite electrodes op of the display section 11 and the opposite electrode op of the peripheral section of the substrate, are securely connected through the discontinuity off of the bank layer bank. Thus, terminals 12 connected to the opposite electrode op of the peripheral section of the substrate are securely connected to the opposite electrode op of the display section 11.

Since the bank layer bank is also formed in an area in which the region that forms the pixel electrode 41 overlaps the relay electrode 35 of the conduction control circuit 50 in this embodiment, no unavailable current flows. Accordingly, the width of the common feed line com can be reduced.

In the production of the active matrix display device 1 having such a configuration, the bank layer bank is formed on the front face of the second insulating film 52 along the scanning lines gate and the data lines sig, as in the first embodiment. Discontinuities portion off are formed at predetermined positions of the bank layer bank. The bank layer bank formed along the data lines sig has a larger width so that it can cover the common feed line com. As a result, the region that forms the organic semiconductive film 43 in the thin film luminescent device 40 is surrounded with the bank layer bank.

Organic semiconductive films 43 corresponding to R, G, and B are formed in a region bounded as a matrix by the bank layer bank by an ink-jet process. A liquid material (a precursor) that forms the organic semiconductive film 43 is discharged into the inner region of the bank layer bank through an ink-jet head and is fixed in the inner region of the bank layer bank to form the organic semiconductive film 43. Since the upper insulating layer 62 of the bank layer bank includes a resist or a polyimide film, it has water-repellent properties. In contrast, the precursor of the organic semiconductive film 43 contains a hydrophilic solution; hence, the region that forms the organic semiconductive film 43 is reliably defined by the bank layer bank, and the solution does not bleed out of the adjacent pixels 7. Since the discontinuities portion off provided in the bank layer bank which bounds the region that forms the organic semiconductive film 43 are narrow, the region that forms the organic semiconductive film 43 can be reliably defined by the bank layer bank, and the solution does not bleed out of the adjacent pixels 7. Accordingly, the organic semiconductive film 43 can be formed within a predetermined region.

Since the precursor discharged from the ink-jet head forms a convex surface with a thickness of approximately 2 μm to 4 μm by the surface tension, the bank layer must have a thickness of approximately 1 μm to 3 μm. Although the precursor discharged from the ink-jet head comes into contact with the upper insulating layer 62 in this state, the solvent in the precursor is removed by heat treatment at 100° C. to 150° C. Thus, the thickness of the organic semiconductive film 43 fixed in the inner region of the bank layer bank is in a range of approximately 0.05 μm to 0.2 μm. The organic semiconductive film 43 no longer is in contact with the upper insulating layer 62.

When the bank layer bank has a height of 1 μm or more, the bank layer bank sufficiently functions as a barrier even if the bank layer bank does not have water-repellent properties. Such a thick bank layer bank can define the region that forms the organic semiconductive film 43 when the film is formed by a coating process in place of the ink-jet process.

Modification of Fifth Embodiment

Figure 10:
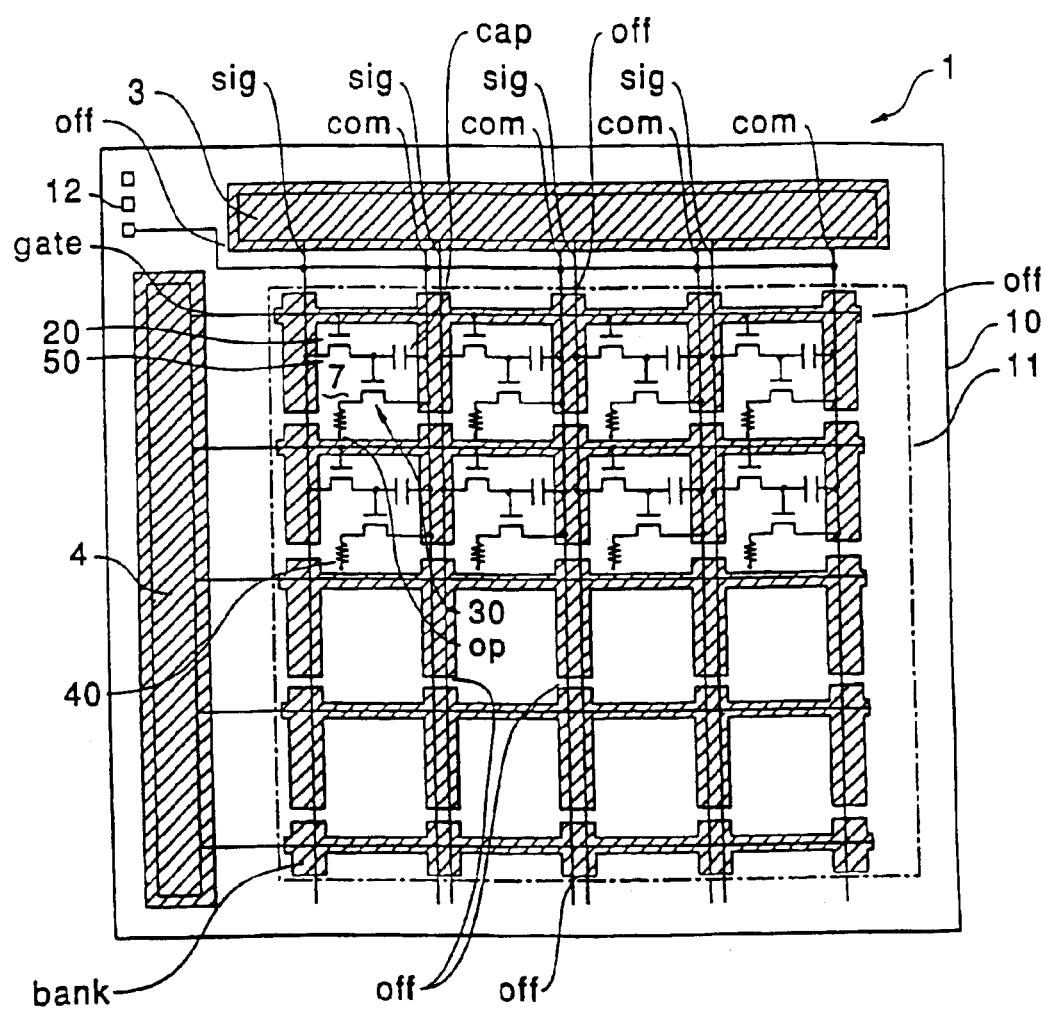
FIG. 10 is a schematic block diagram of an overall layout of an active matrix display device in accordance with a first modification of the fifth embodiment of the present invention.
Figure 11:
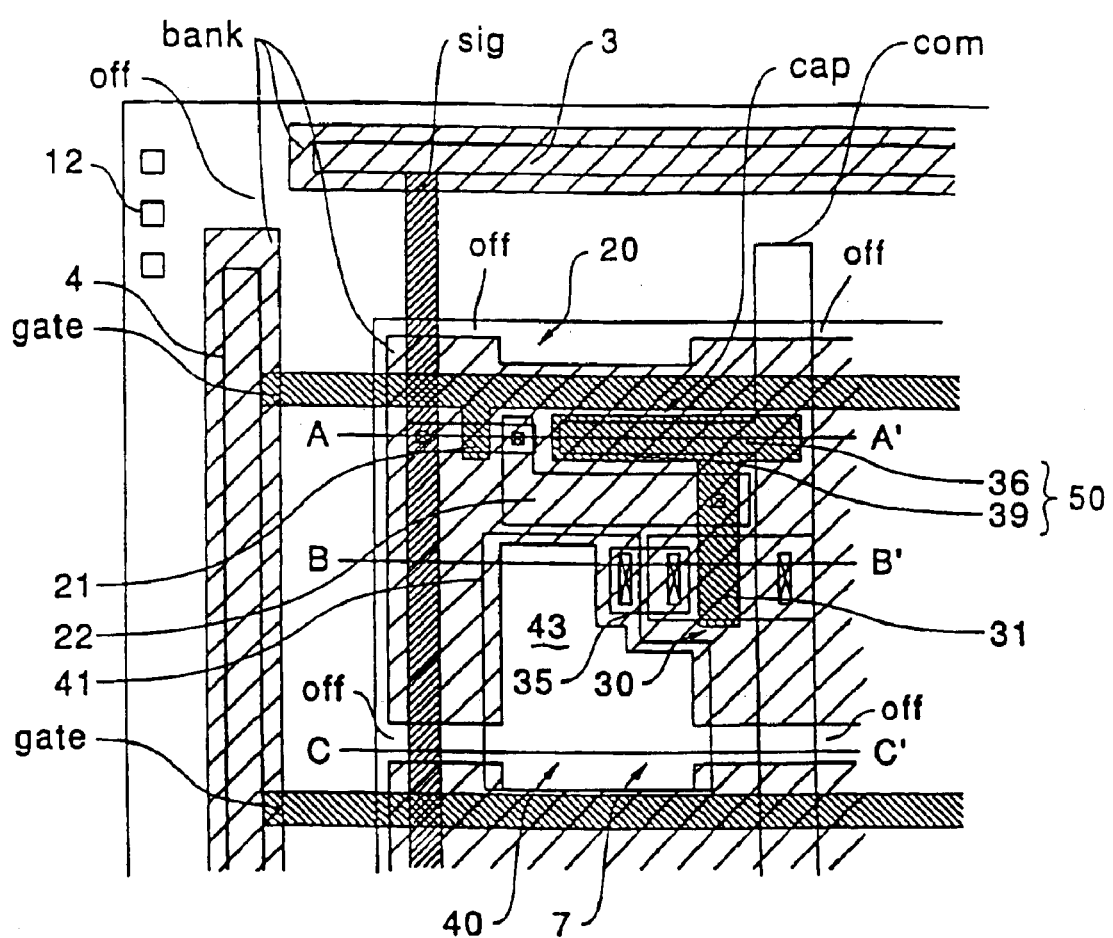
FIG. 11 is a plan view of a pixel of the active matrix display device shown in FIG. 10.
Figure 12A:
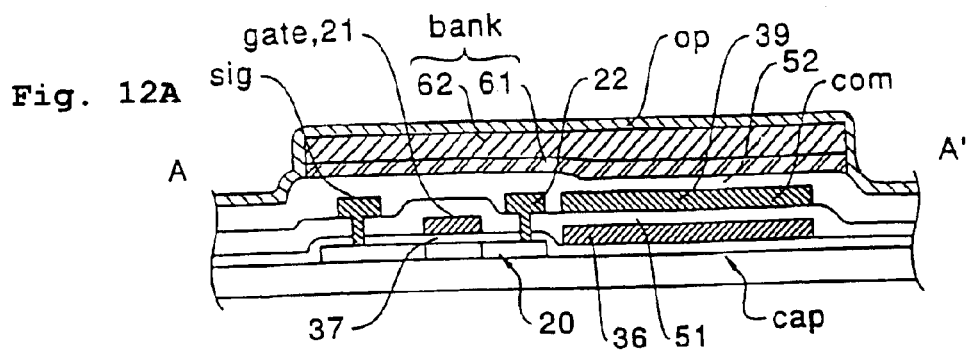
FIGS. 12(A), 12(B) and 12(C) are cross-sectional views taken from line A–A', B–B', and C–C', respectively, in FIG. 11.
Figure 12B:
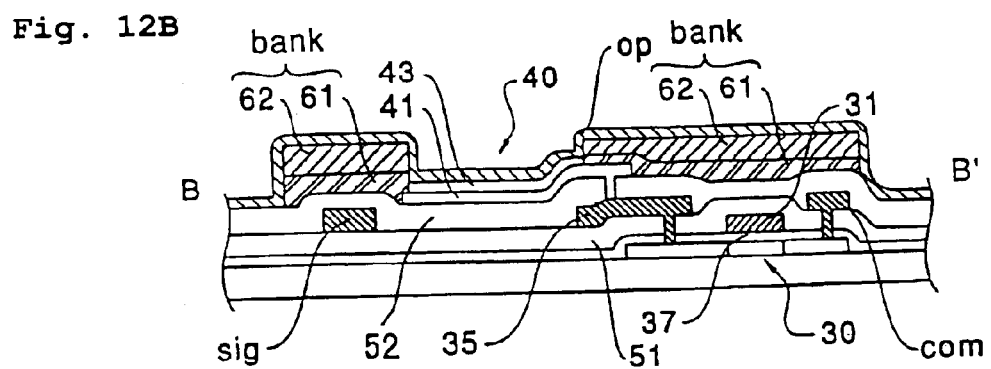
Figure 12C:
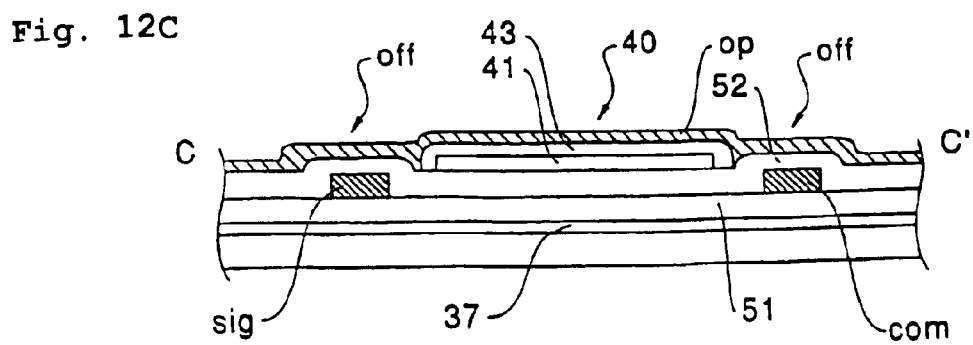

FIG. 10 is a schematic block diagram of an overall layout of an active matrix display device. FIG. 11 is a plan view of a pixel taken from the device. FIGS. 12(A), 12(B) and 12(C) are cross-sectional views taken from line A–A', B–B', and C–C', respectively, in FIG. 11. This embodiment has a basic configuration which is substantially the same as that of the first embodiment; hence, the same symbols are assigned for the same parts, without detailed description thereof.

Also, as shown in FIGS. 10, 11, 12(A), 12(B), and 12(C), in the active matrix display device 1 of this embodiment, an insulating film (a bank layer bank, the region shaded with lines slanting downward to the left or double slanting lines at a wide pitch) which is thicker than an organic semiconductive film 43, is provided along the data line sig and a scanning line gate, and an opposite electrode op is formed above the bank layer bank. Since the second insulating film 52 and the thick bank layer bank are disposed between the data lines sig and the opposite electrode op, parasitic capacitance forming in the data line sig is significantly reduced. Thus, the load on the driving circuits 3 and 4 can be reduced, resulting in lower electrical power consumption and improved display operation.

The bank layer bank includes a lower insulating layer 61 which is formed of an inorganic material, such as a silicon oxide film or a silicon nitride film, and is thicker than the organic semiconductive film 43, and an upper insulating layer 62 which is formed on the lower insulating layer 61 and is formed of an organic material, such as a resist or a polyimide film. Thus, the organic semiconductive film 43 comes into contact with the inorganic lower insulating layer 61, but not with the organic upper insulating layer 62. The organic semiconductive film 43 is, therefore, not damaged by the effects of the organic upper insulating layer 62, and the thin film luminescent device 40, as in the first embodiment, is not subject to decreased luminescent efficiency nor decreased reliability.

In this embodiment, the bank layer bank is formed along the data line sig and the scanning line gate, and each pixel 7 is surrounded with the bank layer bank. Organic semiconductive films 43 can be formed in predetermined positions corresponding to R, G, and B by an ink-jet process; hence, a full color active matrix display device 1 can be manufactured with high productivity.

Furthermore, discontinuities portion off(first discontinuities portion) are provided for the bank layer bank along the scanning line gate between adjacent pixels 7. Discontinuities portion off (first discontinuities portion) are also provided for the bank layer bank at the ends of each data line sig and each scanning line gate. Furthermore, a discontinuity off (second discontinuity) is provided for the bank layer bank between the region that forms the scanning line driving circuit 4 and the region for the data line driving circuit 3. Thus, the opposite electrodes op are securely connected through the flat sections (discontinuities portion off) of the bank layer bank not having steps, and do not cause disconnection.

Second Modification of Fifth Embodiment

Figure 13:
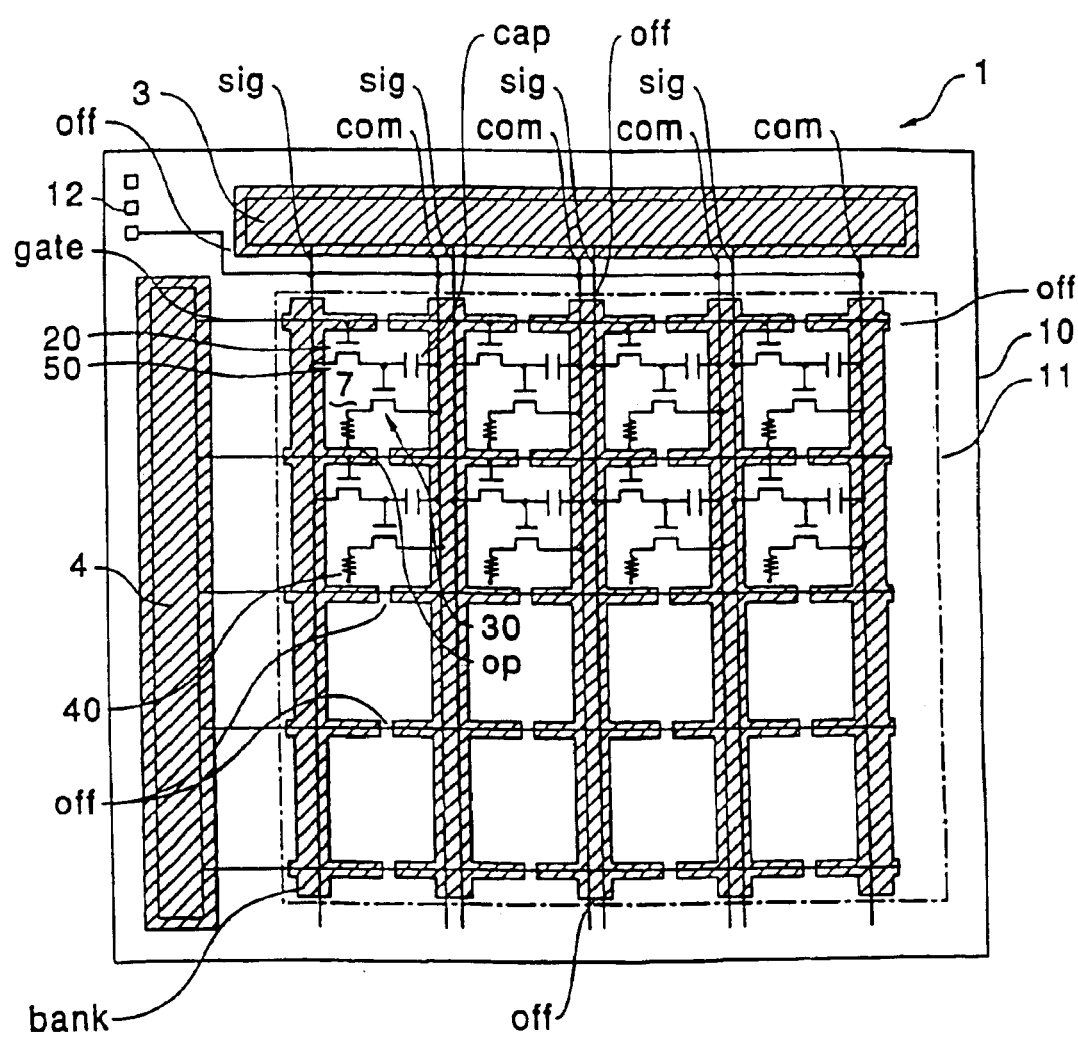
FIG. 13 is a schematic block diagram of an overall layout of an active matrix display device in accordance with a second modification of the fifth embodiment of the present invention.
Figure 14:
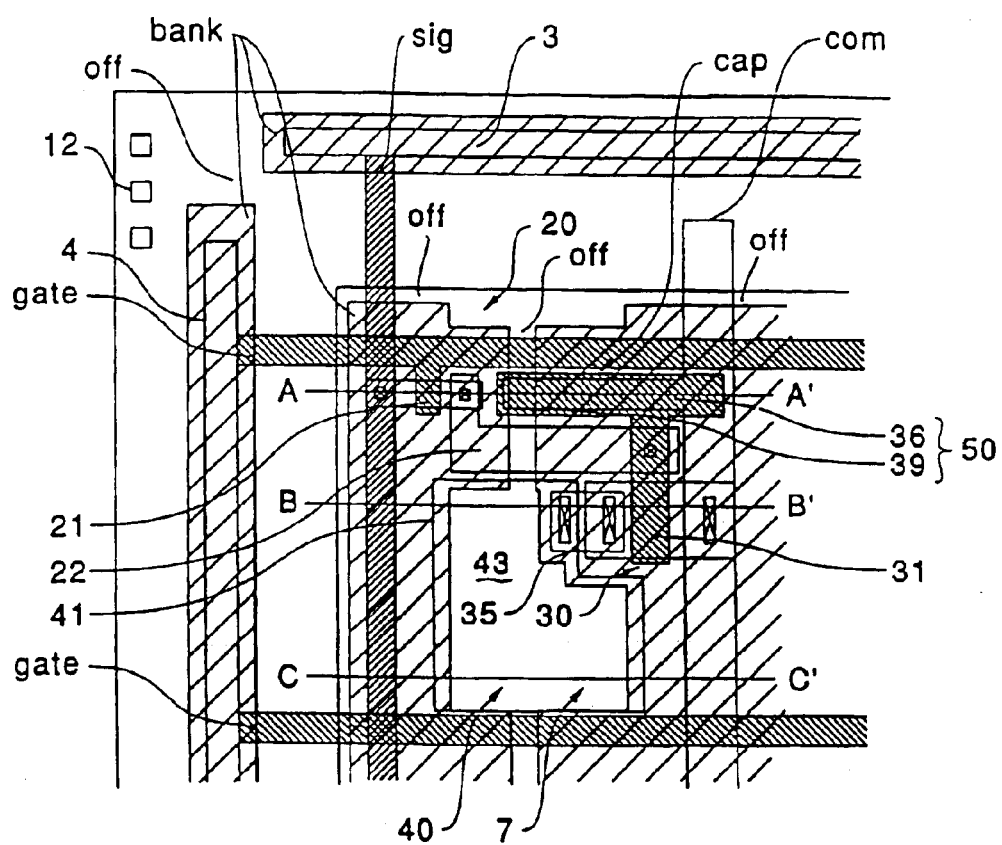
FIG. 14 is a plan view of a pixel of the active matrix display device shown in FIG. 13.
Figure 15A:
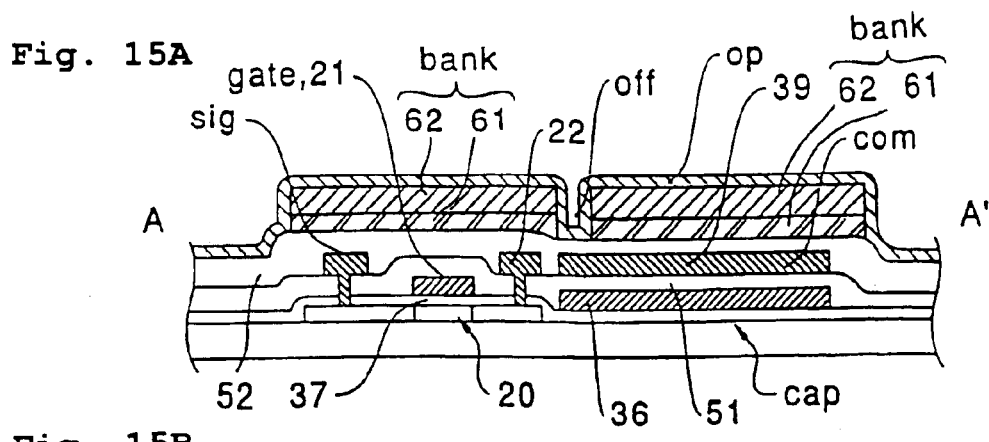
FIGS. 15(A), 15(B) and 15(C) are cross-sectional views taken from line A–A', B–B', and C–C', respectively, in FIG. 14.
Figure 15B:
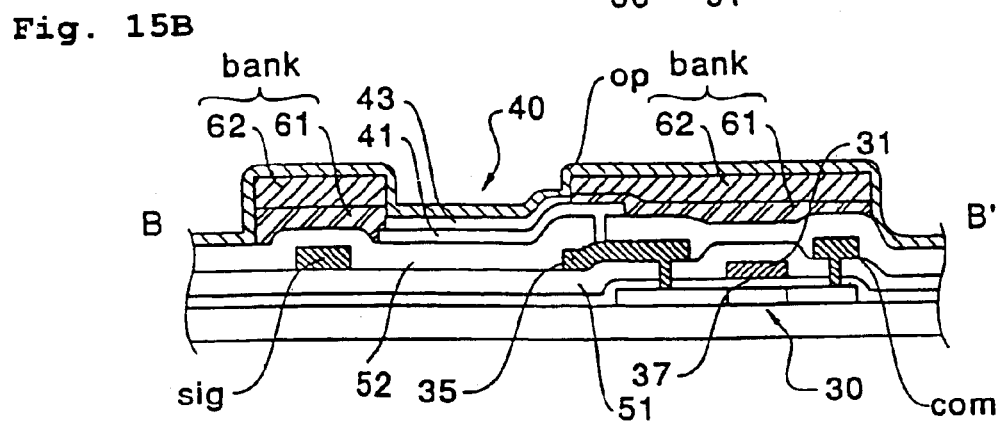
Figure 15C:
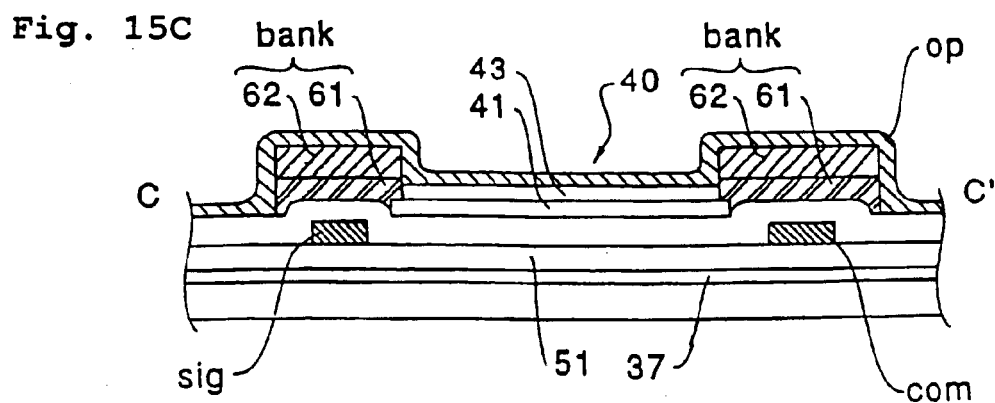

FIG. 13 is a schematic block diagram of an overall layout of an active matrix display device. FIG. 14 is a plan view of a pixel taken from the device. FIGS. 15(A), 15(B) and 15(C) are cross-sectional views taken from line A–A', B–B', and C–C', respectively, in FIG. 14. This embodiment has a basic configuration which is substantially the same as that of the first embodiment; hence, the same symbols are assigned for the same parts, without detailed description thereof.

Also, as shown in FIGS. 13, 14, 15(A), 15(B), and 15(C), in the active matrix display device 1 of this embodiment, an insulating film (a bank layer bank, the region shaded with lines slanting downward to the left or double slanting lines at a wide pitch) which is thicker than an organic semiconductive film 43 is provided along the data line sig and a scanning line gate, and an opposite electrode op is formed above the bank layer bank. Since the second insulating film 52 and the thick bank layer bank are disposed between the data lines sig and the opposite electrode op, parasitic capacitance forming in the data line sig is significantly reduced. Thus, the load on the driving circuits 3 and 4 can be reduced, resulting in lower electrical power consumption and improved display operation.

The bank layer bank includes a lower insulating layer 61 which is formed of an inorganic material, such as a silicon oxide film or a silicon nitride film, and is thicker than the organic semiconductive film 43, and an upper insulating layer 62 which is formed on the lower insulating layer 61 and is formed of an organic material, such as a resist or a polyimide film. Thus, the organic semiconductive film 43 comes into contact with the inorganic lower insulating layer 61, but not with the organic upper insulating layer 62. The organic semiconductive film 43 is, therefore, not damaged by the effects of the organic upper insulating layer 62, and the thin film luminescent device 40, as in the first embodiment, is not subject to decreased luminescent efficiency nor decreased reliability.

In this embodiment, the bank layer bank is formed along the data line sig and the scanning line gate, and each pixel 7 is surrounded with the bank layer bank. Organic semiconductive films 43 can be formed in predetermined positions corresponding to R, G, and B by an ink-jet process; hence, a full color active matrix display device 1 can be manufactured with high productivity.

Furthermore, discontinuities portion off(first discontinuities portion) are provided for the bank layer bank along the data line sig between adjacent pixels 7. Discontinuities portion off (first discontinuities portion) are also provided for the bank layer bank at the ends of each data line sig and each scanning line gate. Furthermore, a discontinuity off (second discontinuity) is provided for the bank layer bank between the region that forms the scanning line driving circuit 4 and the region for the data line driving circuit 3. Thus the opposite electrodes op are securely connected through the flat sections (discontinuities portion off) of the bank layer bank not having steps, and do not cause disconnection.

Third Modification of Fifth Embodiment

Figure 16:
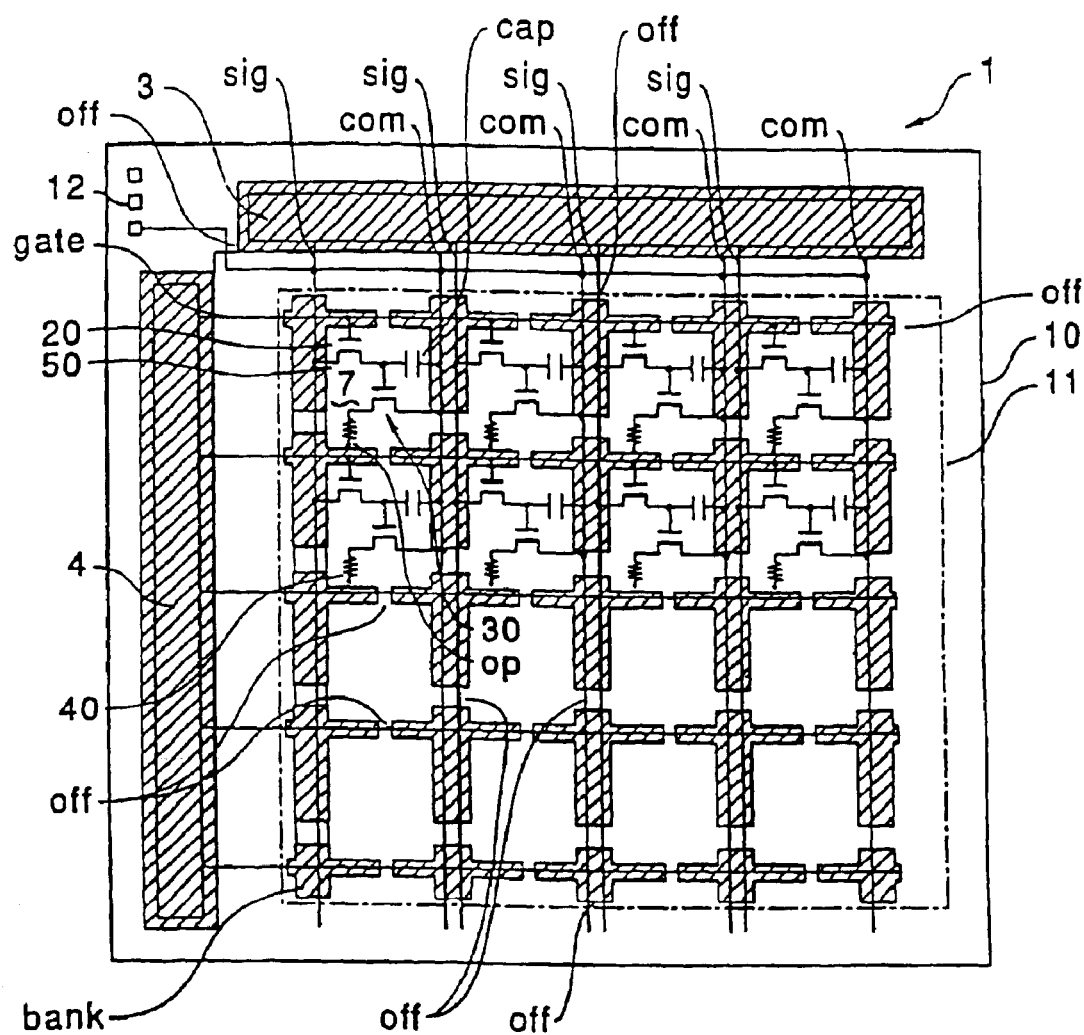
FIG. 16 is a schematic block diagram of an overall layout of an active matrix display device in accordance with a third modification of the fifth embodiment of the present invention.
Figure 17:
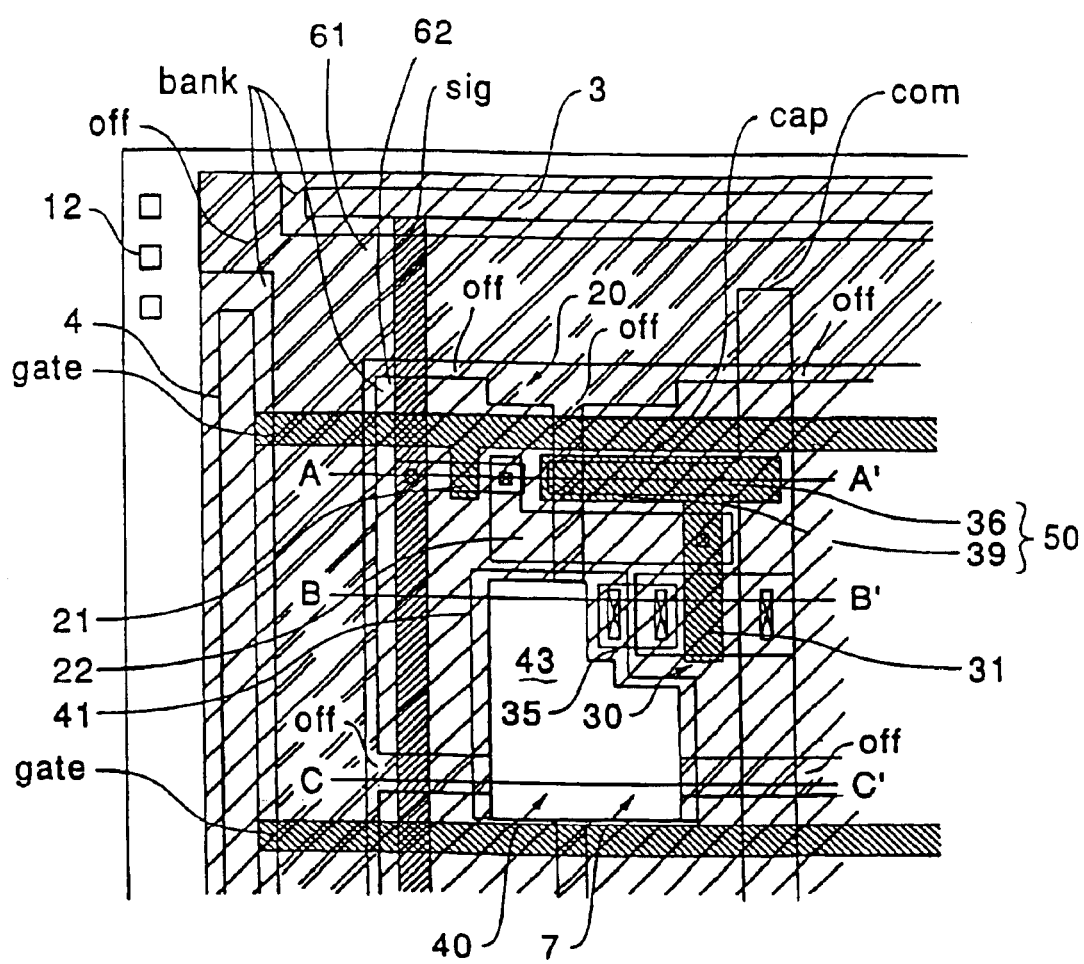
FIG. 17 is a plan view of a pixel of the active matrix display device shown in FIG. 16.
Figure 18A:
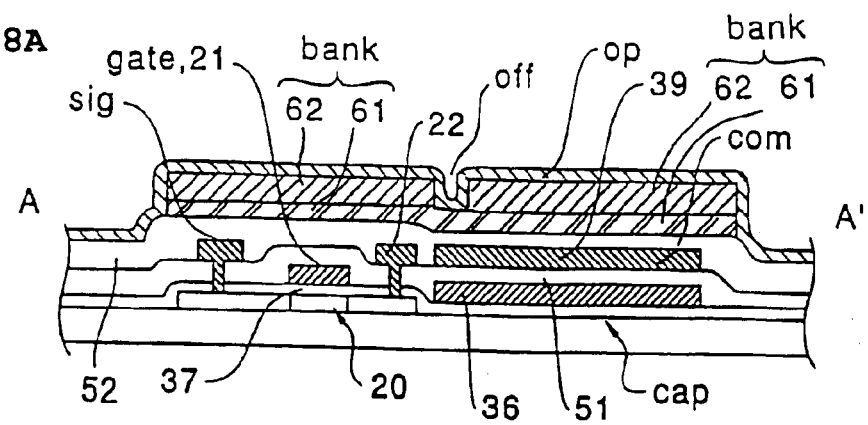
FIGS. 18(A), 18(B) and 18(C) are cross-sectional views taken from line A–A', B–B', and C–C', respectively, in FIG. 17.
Figure 18B:
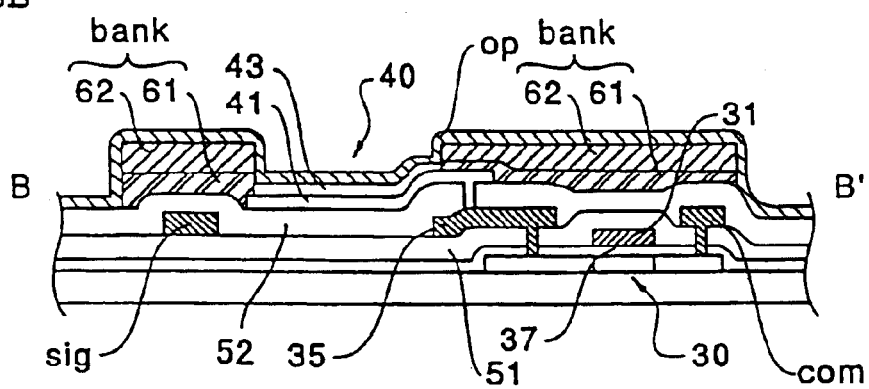
Figure 18C:
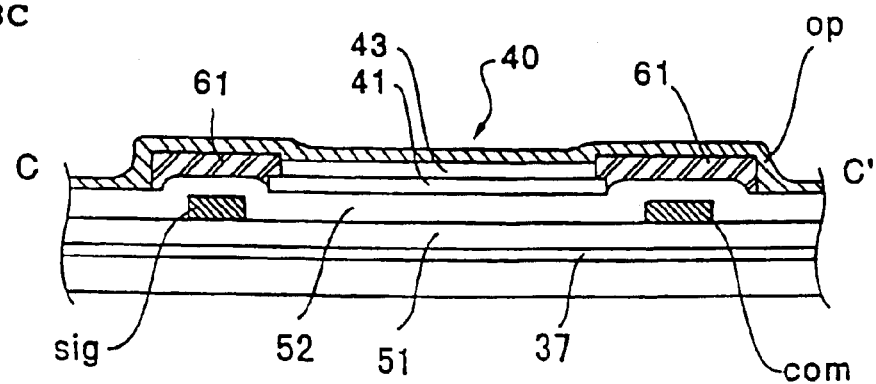

FIG. 16 is a schematic block diagram of an overall layout of an active matrix display device. FIG. 17 is a plan view of a pixel taken from the device. FIGS. 18(A), 18(B), and 18(C) are cross-sectional views taken from line A–A', B–B', and C–C', respectively, in FIG. 17. This embodiment has a basic configuration which is substantially the same as that of the first and fifth embodiments; hence, the same symbols are assigned for the same parts, without detailed description thereof.

Also, as shown in FIGS. 16, 17, 18(A), 18(B), and 18(C), in the active matrix display device 1 of this embodiment, an insulating film (a bank layer bank, the region shaded with lines slanting downward to the left or double slanting lines at a wide pitch) which is thicker than an organic semiconductive film 43, is provided along the data line sig and a scanning line gate, and an opposite electrode op is formed above the bank layer bank. Since the second insulating film 52 and the thick bank layer bank are disposed between the data lines sig and the opposite electrode op, parasitic capacitance forming in the data line sig is significantly reduced. Thus, the load on the driving circuits 3 and 4 can be reduced, resulting in lower electrical power consumption and improved display operation.

The bank layer bank includes a lower insulating layer 61 which is formed of an inorganic material, such as a silicon oxide film or a silicon nitride film, and is thicker than the organic semiconductive film 43, and an upper insulating layer 62, which is formed on the lower insulating layer 61, and is formed of an organic material, such as a resist or a polyimide film.

In this embodiment, the bank layer bank is formed along the data line sig and the scanning line gate, and each pixel 7 is surrounded with the bank layer bank. Organic semiconductive films 43 can be formed in predetermined positions corresponding to R, G, and B by an ink-jet process; hence, a full color active matrix display device 1 can be manufactured with high productivity.

Furthermore, discontinuities portion off (first discontinuities portion) are provided for the bank layer bank along the data line sig between adjacent pixels 7. Discontinuities portion off (first discontinuities portion) are also provided for the bank layer bank at the ends of each data line sig and each scanning line gate. Furthermore, a discontinuity off (second discontinuity) is provided for the bank layer bank between the region that forms the scanning line driving circuit 4 and the region for the data line driving circuit 3.

In this embodiment, however, these discontinuities portion off are provided for only the upper insulating layer 62 among the lower insulating layer 61 (a region shaded by double slashes) and the upper insulating layer 62 (a region shaded by lines slanting down to the left) of the bank layer bank, and thus the lower insulating layer 61 is formed at the discontinuities portion off.

In such a configuration, only the thin lower insulating layer 61 is provided at the discontinuities portion off; hence, the opposite electrode op can be securely connected to each other through the discontinuities portion off without disconnection.

Although the lower insulating layer 61 is formed for the first and second discontinuities portion in this embodiment, the present invention is not limited to this embodiment. The lower insulating layer 61 may be formed for either the first discontinuities portion or the second discontinuity. The configuration of this embodiment in which the lower insulating layer 61 is formed at the discontinuities portion can be applied to the bank layer bank having a pattern described in any other embodiment.

Sixth Embodiment

Figure 19:
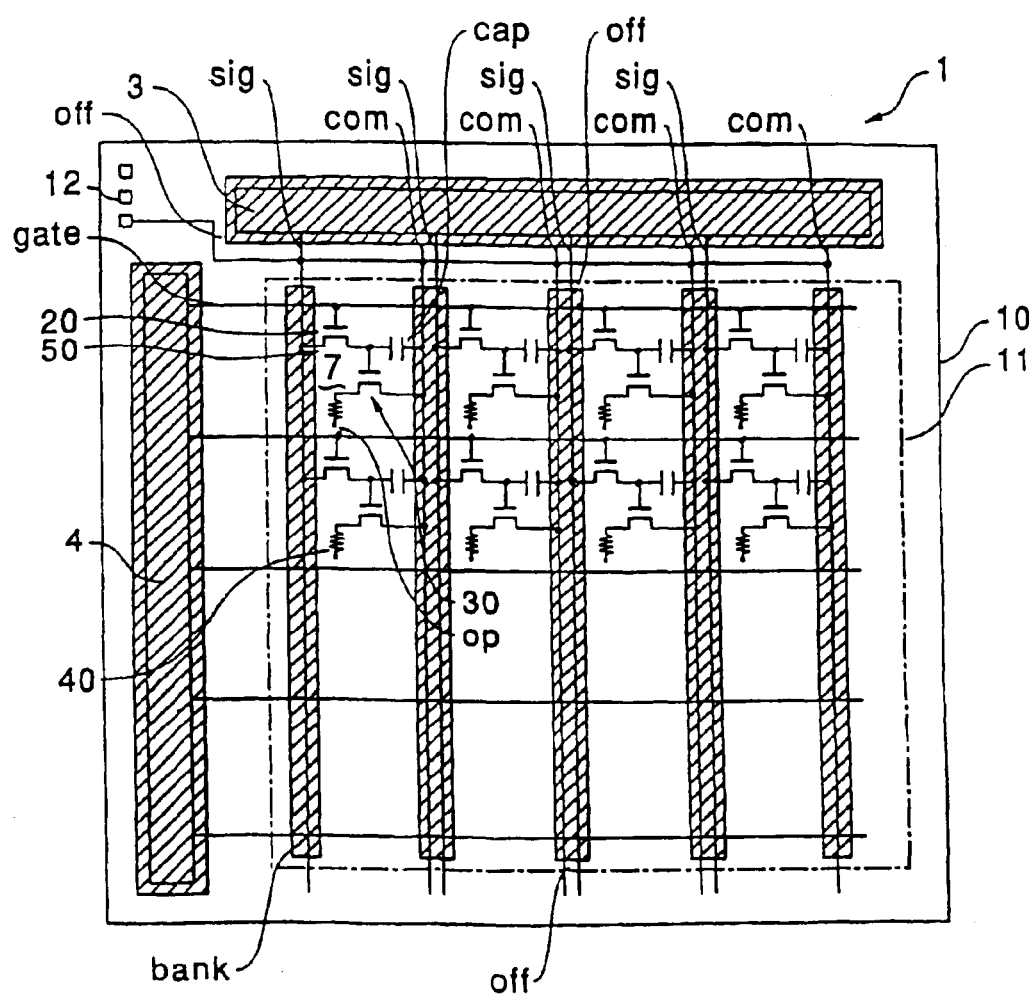
FIG. 19 is a schematic block diagram of an overall layout of an active matrix display device in accordance with a sixth embodiment of the present invention.
Figure 20:
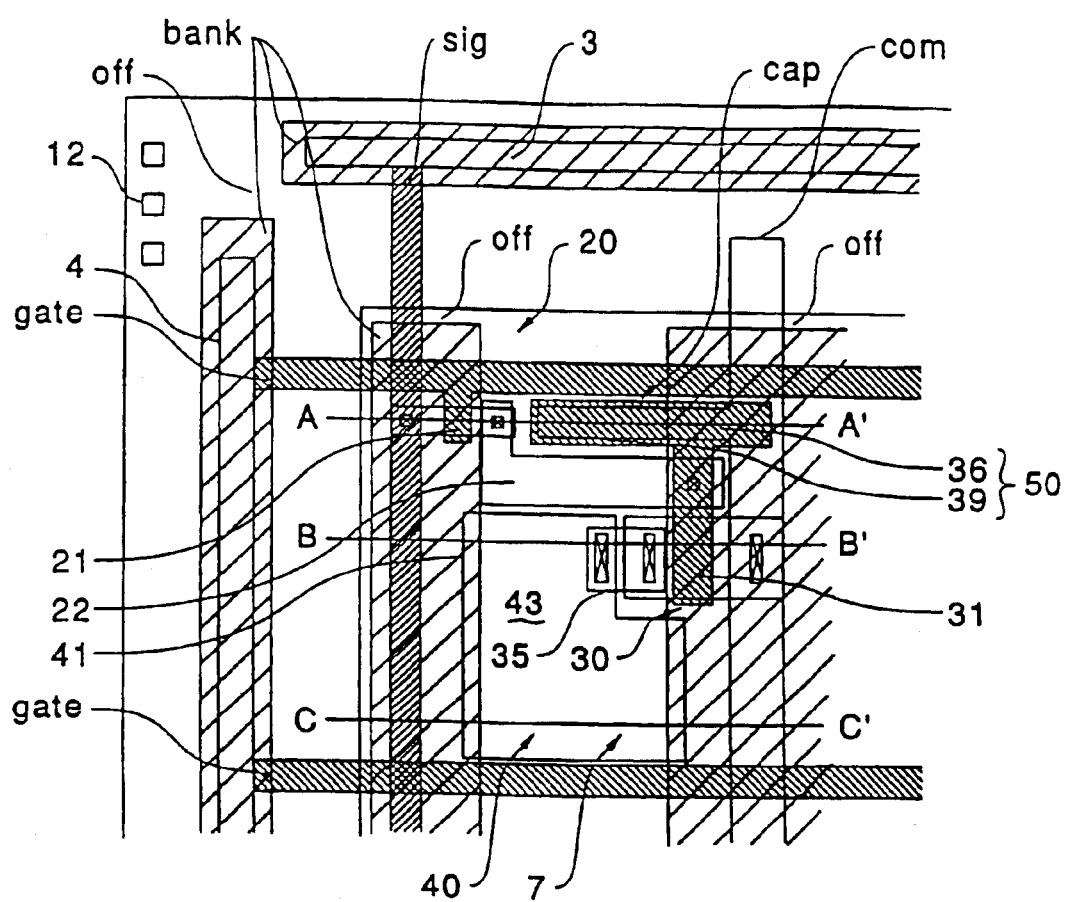
FIG. 20 is a plan view of a pixel of the active matrix display device shown in FIG. 19.
Figure 21A:
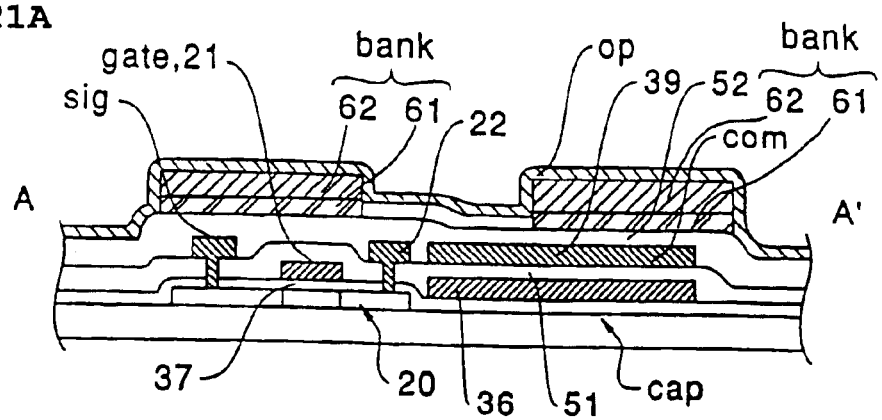
FIGS. 21(A), 21(B) and 21(C) are cross-sectional views taken from line A–A', B–B', and C–C', respectively, in FIG. 20.
Figure 21B:
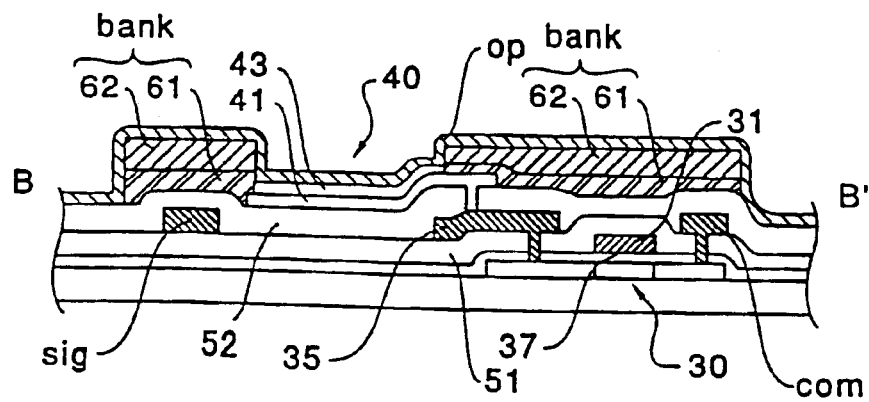
Figure 21C:
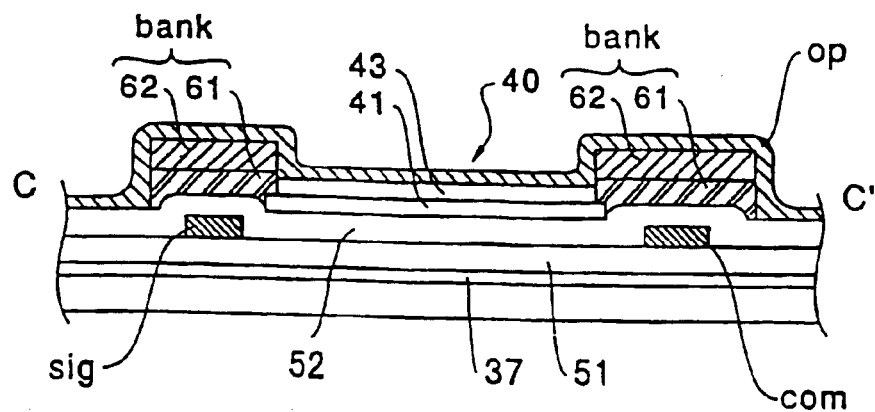

FIG. 19 is a schematic block diagram of an overall layout of an active matrix display device. FIG. 20 is a plan view of a pixel taken from the device. FIGS. 21(A), 21(B) and 21(C) are cross-sectional views taken from line A–A', B–B', and C–C', respectively, in FIG. 20. This embodiment has a basic configuration which is substantially the same as that of the first and fifth embodiments; hence, the same symbols are assigned for the same parts, without detailed description thereof.

Also, as shown in FIGS. 19, 20, 21(A), 21(B), and 21(C), in the active matrix display device 1 of this embodiment, an insulating film (a bank layer bank, the region shaded with lines slanting downward to the left or double slanting lines at a wide pitch) which is thicker than an organic semiconductive film 43, is provided along the data line sig and a scanning line gate, and an opposite electrode op is formed above the bank layer bank. Since the second insulating film 52 and the thick bank layer bank are disposed between the data lines sig and the opposite electrode op, parasitic capacitance forming in the data line sig is significantly reduced. Thus, the load on the driving circuits 3 and 4 can be reduced, resulting in lower electrical power consumption and improved display operation.

The bank layer bank includes a lower insulating layer 61, which is formed of an inorganic material, such as a silicon oxide film or a silicon nitride film, and is thicker than the organic semiconductive film 43, and an upper insulating layer 62, which is formed on the lower insulating layer 61 and is formed of an organic material, such as a resist or a polyimide film. Thus, the organic semiconductive film 43 comes into contact with the inorganic lower insulating layer 61, but not with the organic upper insulating layer 62. The organic semiconductive film 43 is, therefore, not damaged by the effects of the organic upper insulating layer 62, and the thin film luminescent device 40 is not subject to decreased luminescent efficiency nor decreased reliability.

Since the bank layer bank is formed along the data line sig in this embodiment, organic semiconductive film 43 having a striped pattern, corresponding to R, G, and B, can be formed in striped regions bounded by the bank layer bank by an ink-jet process; hence a full color active matrix display device 1 can be made with high productivity.

In addition, discontinuities portion off (first discontinuities portion) are provided for both the lower insulating layer 61 and the upper insulating layer 62 of the bank layer bank along the data lines sig at the ends of each data line sig. Thus, the opposite electrode op of each pixel 7 is connected to the opposite electrode op of the adjacent pixel 7 over the thick bank layer bank in the direction of the scanning line gate. In the direction of the data line sig, however, the opposite electrode op of each pixel 7 is connected to the opposite electrode op of the adjacent pixel 7 at the discontinuity off (the flat section not having a step due to the bank layer bank) at the ends of the data line sig. Since the opposite electrode op of each pixel 7 is connected to the opposite electrode op of the adjacent pixel 7 at the flat section not having a step due to the bank layer bank, the opposite electrode op of each pixel 7 does not cause disconnection.

In the peripheral region of the transparent substrate 10 (the outer region of the display section 11), the data line driving circuit 3 and the scanning line driving circuit 4 are covered with the bank layer bank. Thus, the opposite electrode op provided above the region that forms these driving circuits is separated by the bank layer bank from the lead layer of these driving circuits. Since formation of the parasitic capacitance in the driving circuits can be prevented, the load on the driving circuits 3 and 4 can be reduced, resulting in lower electrical power consumption and improved display operation.

Furthermore, the bank layer bank, which is formed above the scanning line driving circuit 4 and the data line driving circuit 3, has a discontinuity off (second discontinuity) between the region that forms the scanning line driving circuit 4 and the region for the data line driving circuit 3. The opposite electrodes are securely connected through the flat section not having a step due to the bank layer bank (the discontinuity off) without disconnection.

Other Embodiments

As described in the third modification of the fifth embodiment, the configuration in which only the upper insulating layer 62 has discontinuities portion off of the bank layer bank may also be applied to the sixth embodiment.

As described in the fifth and sixth embodiments, the concept of provision of discontinuities portion off in the bank layer bank that avoids disconnection of the opposite electrodes op, is also applicable to a bank layer bank formed of an inorganic material, as described in the third embodiment.

Industrial Applicability

As described above, in the active matrix display device in accordance with the present invention, the insulating film, which is formed so as to surround the region that forms the organic semiconductive film includes a lower insulating layer, which is formed of an inorganic material, and is thicker than the organic semiconductive film, and an upper insulating layer which is formed thereon and is formed of an organic material. Since a thick insulating film is disposed between the data line and the opposite electrode, formation of parasitic capacitance in the data line can be prevented. Thus, the load on the data line driving circuit can be reduced, resulting in lower electrical power consumption and improved display operation. In the present invention, only the lower insulating layer in contact with the organic semiconductive film of the thin film luminescent device is formed of an inorganic material, and the upper insulating layer formed thereon is formed of an organic material, which facilitates formation of a thick film. Thus, the process has high productivity. The upper insulating layer does not come into contact with the organic semiconductive film, but the lower insulating layer formed of an inorganic material does come into contact with the organic semiconductive film; hence, the organic semiconductive film is protected from deterioration caused by the upper insulating layer. Accordingly, the thin film luminescent device does not cause decreased luminescent efficiency or reliability.

When the upper insulating layer is deposited in an inner region of the lower insulating layer so as to have a width narrower than that of the upper insulating layer, contact of the upper insulating layer formed of an organic material with the organic semiconductive film is more reliably prevented.

In another embodiment of the present invention, the insulating film formed so as to surround the region that forms the organic semiconductive film includes a lower insulating layer formed of an inorganic material and an upper insulating layer, which is formed on an inner region of the lower insulating layer, and has a smaller width than that of the lower insulating layer. Thus, the thick insulating film disposed between the data line and the opposite electrode can prevent formation of parasitic capacitance in the data line. Thus, the load on the data line driving circuit can be reduced, resulting in lower electrical power consumption and improved display operation. When a lower inorganic insulating film and an upper inorganic film are formed and when the upper insulating layer is patterned, the lower insulating layer functions as an etching stopper. Thus, overetching which would damage the pixel electrode does not occur. After patterning of the upper insulating layer, only a single layer of the lower insulating layer is etched in the succeeding patterning. Thus, the etching is readily controlled and overetching which would damage the pixel electrode does not occur.

What is claimed is:

1. A display device comprising:
an opposite electrode; and
a plurality of pixels, each of the plurality of pixels including:
a pixel electrode; and
an organic semiconductive film deposited between the pixel electrode and the opposite electrode, the organic semiconductive film being surrounded by an insulating film that includes a plurality of insulating layers, the opposite electrode and the insulating film not being formed in a region where a terminal is formed.

2. A display device comprising:
a plurality of scanning lines formed above a substrate;
a plurality of data lines formed above the substrate;
a plurality of common feed lines formed above the substrate;
a plurality of pixel electrodes disposed correspondingly to intersections between the plurality of data lines and the plurality of scanning lines, each of the plurality of pixel electrodes being electrically connectable to one common feed line of the plurality of common feed lines through a transistor;
an opposite electrode formed for the pixel electrodes in common,
an insulating film that includes a plurality of insulating layers disposed between the data lines and the opposite electrode, and
terminals formed above the substrate, the terminals being not covered by the opposite electrode and the insulating film.

3. The display device according to claim 2, an organic semiconductive film being disposed between each of the pixel electrode and the opposite electrode.

4. The display apparatus according to claim 2, the terminals that include a terminal connected to the plurality of common feed lines.

5. The display apparatus according to claim 2, further comprising a scanning line driving circuit to drive the plurality of scanning lines, and the terminals being formed on peripheral region of the scanning line driving circuit of the substrate.

6. The display apparatus according to claim 2, further comprising a scanning line driving circuit to drive the plurality of scanning lines and a data line driving circuit to drive the plurality of data lines, the terminals being formed on a peripheral region of the scanning line driving circuit and the data line driving circuit of the substrate.

7. A display device comprising:

a substrate;

terminals formed on the substrate;

a plurality of pixel electrodes disposed in a display section of the substrate; and an opposite electrode formed over the display section;

an organic semiconductive film being disposed between each of the plurality of pixel electrodes and the opposite electrode, the organic semiconductive film being surrounded by an insulating film that includes a plurality of insulating layers, and the insulating film being formed for a display section other than a region where a terminal is formed.

8. The display apparatus according to claim 7, the terminals including a terminal electrically connected to the opposite electrode.

* * * * *